United States Patent
Takechi et al.

(10) Patent No.: US 10,656,213 B2
(45) Date of Patent: May 19, 2020

(54) INTERNAL RESISTANCE CALCULATION DEVICE, RECORDING MEDIUM, AND INTERNAL RESISTANCE CALCULATION METHOD

(71) Applicant: Sumitomo Electric Industries, Ltd., Osaka-shi (JP)

(72) Inventors: Hiroaki Takechi, Osaka (JP); Tomomi Kataoka, Osaka (JP); Youhei Yamaguchi, Osaka (JP); Aoi Hatanaka, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 256 days.

(21) Appl. No.: 15/760,518

(22) PCT Filed: Jun. 23, 2016

(86) PCT No.: PCT/JP2016/068651
§ 371 (c)(1),
(2) Date: Mar. 15, 2018

(87) PCT Pub. No.: WO2017/047192
PCT Pub. Date: Mar. 23, 2017

(65) Prior Publication Data
US 2018/0252776 A1    Sep. 6, 2018

(30) Foreign Application Priority Data
Sep. 18, 2015 (JP) .................................. 2015-185635

(51) Int. Cl.
*G01R 31/389* (2019.01)
*G01R 31/378* (2019.01)
(Continued)

(52) U.S. Cl.
CPC .......... *G01R 31/389* (2019.01); *G01R 31/36* (2013.01); *G01R 31/3648* (2013.01);
(Continued)

(58) Field of Classification Search
CPC ................ G01R 31/389; G01R 31/378; G01R 31/3648; G01R 31/3842; G01R 31/374; G01R 31/392; G01R 31/36
See application file for complete search history.

(56) References Cited

U.S. PATENT DOCUMENTS
2013/0080096 A1* 3/2013 Toki ........................ G06F 15/00
702/63

FOREIGN PATENT DOCUMENTS
JP      2010-175484 A    8/2010
JP         4923929 B2    4/2012
(Continued)

*Primary Examiner* — Amy He
(74) *Attorney, Agent, or Firm* — Baker Botts L.L.P.; Michael A. Sartori

(57) ABSTRACT

An internal resistance calculation device is provided with: a voltage obtaining portion that obtains the voltage of a secondary battery; a current obtaining portion that obtains the current of the secondary battery; a switching determination portion that determines the presence or absence of switching between charging and discharging of the secondary battery based on the obtained current; an identification portion that identifies a waiting time based on a boundary frequency range in which the diffusion impedance arising from the process of diffusion of a predetermined ion contributes to the impedance of the secondary battery in the impedance spectrum of the secondary battery; and a resistance calculation portion that calculates the internal resistance of the secondary battery based on the voltage and the current obtained after the identified waiting time in a case
(Continued)

where it is determined that switching between charging and discharging of the secondary battery is present.

17 Claims, 26 Drawing Sheets

(51) Int. Cl.
  *G01R 31/36* (2020.01)
  *G01R 31/392* (2019.01)
  *G01R 31/3842* (2019.01)
  *G01R 31/374* (2019.01)
(52) U.S. Cl.
  CPC .......... *G01R 31/378* (2019.01); *G01R 31/374* (2019.01); *G01R 31/3842* (2019.01); *G01R 31/392* (2019.01)

(56) References Cited

FOREIGN PATENT DOCUMENTS

| | | |
|---|---|---|
| JP | 2014-035283 A | 2/2014 |
| JP | 2015-109237 A | 6/2015 |
| WO | 2011/155184 A1 | 12/2011 |

\* cited by examiner

FIG. 8

| SOC(%) | WAITING TIME(s) |
|---|---|
| 90以上 | 0.06 |
| 80−90 | 0.06 |
| 70−80 | 0.06 |
| 60−70 | 0.1 |
| 50−60 | 0.12 |
| 40−50 | 0.13 |
| 30−40 | 0.13 |
| 20−30 | 0.13 |
| 10−20 | 0.15 |
| 10以下 | 0.16 |

INTERNAL RESISTANCE CALCULATION DEVICE, RECORDING MEDIUM, AND INTERNAL RESISTANCE CALCULATION METHOD

CROSS-REFERENCE TO RELATED APPLICATIONS

This application is the national phase under 35 U.S.C. § 371 of PCT International Application No. PCT/JP2016/068651 which has an International filing date of Jun. 23, 2016 and designated the United States of America. (US only)

FIELD

The present invention relates to an internal resistance calculation device, a recording medium, and an internal resistance calculation method.

The present application claims priority based on Japanese Patent Application No. 2015-185635 filed on Sep. 18, 2015, Japanese Patent Application No. 2016-001983 filed on Jan. 7, 2016, Japanese Patent Application No. 2016-044721 field on Mar. 8, 2016, and Japanese Patent Application No. 2016-083939 field on Apr. 19, 2016, and all the contents described in the above Japanese patent applications are adopted herein.

BACKGROUND

In recent years, vehicles such as an HEV (hybrid electric vehicle) and an EV (electric vehicle) have been spreading. The HEV and the EV are mounted with a secondary battery. In the HEV, the vehicle is driven or the engine is assisted by driving a motor by using the power stored in the secondary battery. For this reason, in the HEV, switching between charging and discharging of the secondary battery is frequently repeated with the traveling. Since an overcharge or an overdischarge deteriorates the secondary battery, it is necessary to control charging and discharging while grasping the amount of charge of the secondary battery.

Moreover, to determine the deterioration of the secondary battery, it is necessary to accurately grasp the internal resistance of the secondary battery.

For example, an internal resistance estimation device has been disclosed that estimates the internal resistance of the secondary battery based on the time elapsed from the detection of switching from charging to discharging or discharging to charging of the secondary battery when it is determined that the magnitude of the charging/discharging current of the secondary battery continues for a predetermined time period or longer under a condition where it is within a predetermined range (see Japanese Patent No. 4923929).

SUMMARY

An internal resistance calculation device according to the present disclosure includes a voltage obtaining portion that obtains a voltage of the secondary battery; a current obtaining portion that obtains a current of the secondary battery; a switching determination portion that determines the presence or absence of switching between charging and discharging of the secondary battery based on the current obtained by the current obtaining portion; an identification portion that identifies a waiting time based on a boundary frequency range in which a diffusion impedance arising from a process of diffusion of a predetermined ion contributes to an impedance of the secondary battery in an impedance spectrum of the secondary battery; and a resistance calculation portion that calculates the internal resistance of the secondary battery based on the voltage obtained by the voltage obtaining portion and the current obtained by the current obtaining portion after the waiting time identified by the identification portion when the switching determination portion determines that switching between charging and discharging is present.

A recording medium according to the present disclosure a computer readable non-transitory recording medium recording a computer program for causing the computer to function as: a voltage obtaining portion that obtains a voltage of the secondary battery; a current obtaining portion that obtains a current of the secondary battery; a switching determination portion that determines the presence or absence of switching between charging and discharging of the secondary battery based on the obtained current; an identification portion that identifies a waiting time based on a boundary frequency range in which a diffusion impedance arising from a process of diffusion of a predetermined ion contributes to an impedance of the secondary battery in an impedance spectrum of the secondary battery; and a resistance calculation portion that calculates the internal resistance of the secondary battery based on the voltage and the current obtained after the identified waiting time in a case where it is determined that switching between charging and discharging of the secondary battery is present.

An internal resistance calculation method according to the present disclosure, wherein a voltage obtaining portion obtains a voltage of the secondary battery; a current obtaining portion obtains a current of the secondary battery; a switching determination portion determines the presence or absence of switching between charging and discharging of the secondary battery based on the obtained current; an identification portion identifies a waiting time based on a boundary frequency range in which a diffusion impedance arising from a process of diffusion of a predetermined ion contributes to an impedance of the secondary battery in an impedance spectrum of the secondary battery; and a resistance calculation portion calculates the internal resistance of the secondary battery based on the voltage and the current obtained after the identified waiting time in a case where it is determined that switching between charging and discharging of the secondary battery is present.

The above and further objects and features of the invention will more fully be apparent from the following detailed description with accompanying drawings.

BRIEF DESCRIPTION OF THE DRAWINGS

FIG. 8 An explanatory view showing an example of the waiting time corresponding to a boundary frequency range of the secondary battery unit of the present embodiment.

Figure 1:
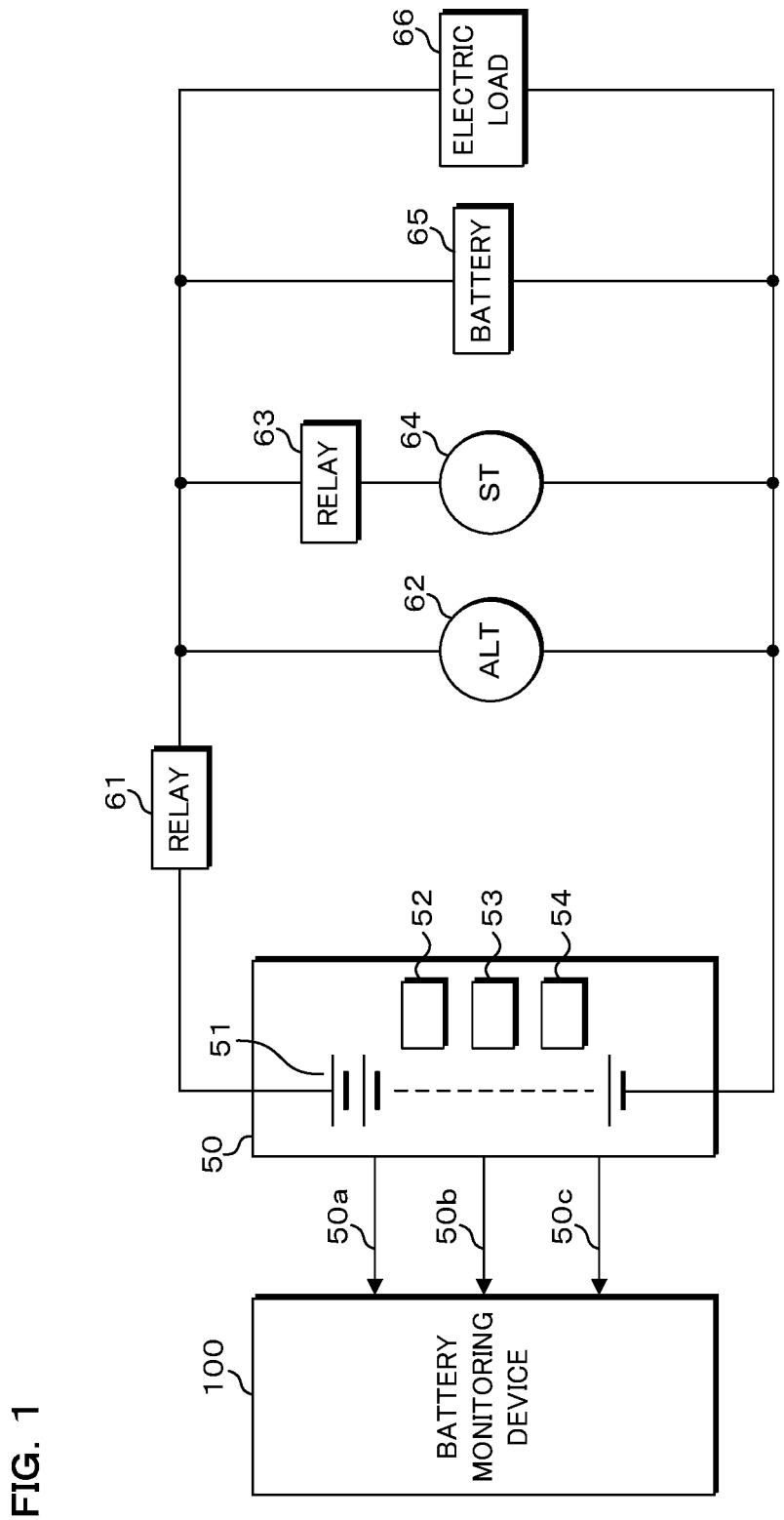
FIG. 1 A block diagram showing an example of the structure of a relevant part of a vehicle mounted with a battery monitoring device as the internal resistance calculation device of the present embodiment.

However, in the device of Japanese Patent No. 4923929, to estimate the internal resistance of the secondary battery, it is necessary for the charging/discharging current to continue for a predetermined time period or longer under a condition where it is within a predetermined range. However, since the predetermined time period is a time period where the difference between the transition of the actual internal resistance value and the transition of the internal resistance value obtained from the inclination of the IV line becomes not less than a predetermined value, it is necessary to wait until the charging time or the discharging time sufficiently elapses, and the internal resistance cannot be estimated unless a comparatively long time elapses after switching to charging or to discharging. For this reason, in the HEV or a vehicle mounted with a regeneration system where charging and discharging are frequently repeated, there are cases where the estimation of the internal resistance of the secondary battery is difficult.

Accordingly, it is an object to provide an internal resistance calculation device capable of accurately calculating the internal resistance of the secondary battery in a comparatively short time after switching of charging or discharging even when charging and discharging are repeated frequently, and a computer program and an internal resistance calculation method for implementing the internal resistance calculation device.

According to the present disclosure, even when charging and discharging are repeated frequently, the internal resistance of the secondary battery can be accurately calculated in a comparatively short time after switching of charging or discharging.

An internal resistance calculation device according to the present embodiment includes a voltage obtaining portion that obtains a voltage of the secondary battery; a current obtaining portion that obtains a current of the secondary battery; a switching determination portion that determines the presence or absence of switching between charging and discharging of the secondary battery based on the current obtained by the current obtaining portion; an identification portion that identifies a waiting time based on a boundary frequency range in which a diffusion impedance arising from a process of diffusion of a predetermined ion contributes to an impedance of the secondary battery in an impedance spectrum of the secondary battery; and a resistance calculation portion that calculates the internal resistance of the secondary battery based on the voltage obtained by the voltage obtaining portion and the current obtained by the current obtaining portion after the waiting time identified by the identification portion when the switching determination portion determines that switching between charging and discharging is present.

A computer program according to the present embodiment causing the computer to function as: a voltage obtaining portion that obtains a voltage of the secondary battery; a current obtaining portion that obtains a current of the secondary battery; a switching determination portion that determines the presence or absence of switching between charging and discharging of the secondary battery based on the obtained current; an identification portion that identifies a waiting time based on a boundary frequency range in which a diffusion impedance arising from a process of diffusion of a predetermined ion contributes to an impedance of the secondary battery in an impedance spectrum of the secondary battery; and a resistance calculation portion that calculates the internal resistance of the secondary battery based on the voltage and the current obtained after the identified waiting time in a case where it is determined that switching between charging and discharging of the secondary battery is present.

An internal resistance calculation method according to the present embodiment, wherein a voltage obtaining portion obtains a voltage of the secondary battery; a current obtaining portion obtains a current of the secondary battery; a switching determination portion determines the presence or absence of switching between charging and discharging of the secondary battery based on the obtained current; an identification portion identifies a waiting time based on a boundary frequency range in which a diffusion impedance arising from a process of diffusion of a predetermined ion contributes to an impedance of the secondary battery in an impedance spectrum of the secondary battery; and a resistance calculation portion calculates the internal resistance of the secondary battery based on the voltage and the current obtained after the identified waiting time in a case where it is determined that switching between charging and discharging of the secondary battery is present.

The voltage obtaining portion obtains the voltage of the secondary battery, and the current obtaining portion obtains the current (the charging current or the discharging current) of the secondary battery. The switching determination portion determines the presence or absence of switching between charging and discharging of the secondary battery based on the current obtained by the current obtaining portion. For example, one of charging and discharging is defined as positive, and it can be determined that switching between charging and discharging is present when the current changes from positive to negative or to 0, when the current changes from 0 to positive or to negative or when the current changes from negative to positive or to 0.

The identification portion identifies the waiting time based on a boundary frequency range in which the diffusion impedance arising from the process of diffusion of a predetermined ion contributes to the impedance of the secondary battery in the impedance spectrum of the secondary battery. The impedance spectrum, which is also called Cole-Cole plot or Nyquist plot, is a plot of values obtained by measuring the impedance of the secondary battery at a plurality of frequencies by using an AC impedance method.

The secondary battery can be expressed by an equivalent circuit formed of an electrolyte solution bulk resistance Rs, an interface charge transfer resistance Rc, an electric double layer capacitance C and a diffusion impedance Zw. Regarding the internal resistance of the secondary battery, the electrolyte solution bulk resistance Rs and the interface charge transfer resistance Rc constitute a main part thereof. On the other hand, when the frequency in the AC impedance method is changed from a high frequency to a low frequency, in a certain frequency range (referred to as boundary frequency range), the diffusion impedance Zw increases, and the impedance of the secondary battery increases (contributes to the impedance of the secondary battery). Accordingly, it can be said that the impedance in the boundary frequency range before the diffusion impedance Zw increases represents the internal resistance of the secondary battery. Between the frequency f in the AC impedance method and the waiting time T from when the AC current is passed to when measurement is performed, a relationship $T=1/(2 \times f)$, that is, the waiting time T can be identified, for example, from a relationship of being the reciprocal of twice the frequency f. For example, when the frequency f is 5 Hz, the waiting time T is 0.1 second. That the waiting time T is the reciprocal of twice the frequency f is an example; for example, the waiting time T may be the reciprocal of four times the frequency f.

When the switching determination portion determines that switching between charging and discharging is present, the resistance calculation portion calculates the internal resistance of the secondary battery based on the voltage obtained by the voltage obtaining portion and the current obtained by the current obtaining portion after the waiting time identified by the identification portion. When switching from charging to discharging or from discharging to charging is made, of the internal resistance of the secondary battery, for example, the diffusion resistance (diffusion impedance) and the charge transfer resistance are reset once, and the internal resistance starts to increase according to the energization time. Accordingly, when it is determined that switching between charging and discharging is present, the internal resistance of the secondary battery can be calculated by obtaining the voltage Vc and the current IC after the waiting time T. Thereby, the internal resistance can be obtained in a short time (for example, approximately 0.1 second) after switching between charging and discharging, so that the internal resistance of the secondary battery can be accurately calculated in a comparatively short time after switching of charging or discharging are repeated frequently.

The internal resistance calculation device according to the present embodiment wherein the resistance calculation portion calculates the internal resistance of the secondary battery based on the voltage obtained by the voltage obtaining portion and the current obtained by the current obtaining portion before the switching determination portion determines that switching between charging and discharging is present and the voltage obtained by the voltage obtaining portion and the current obtained by the current obtaining portion after the waiting time identified by the identification portion.

The resistance calculation portion calculates the internal resistance R of the secondary battery based on the voltage Vb obtained by the voltage obtaining portion and the current Ib obtained by the current obtaining portion before the switching determination portion determines that switching between charging and discharging is present and the voltage Vc obtained by the voltage obtaining portion and the current Ic obtained by the current obtaining portion after the waiting time T identified by the identification portion. The absolute value of the inclination of the straight line obtained from the voltage and current between two points represents the internal resistance of the secondary battery. Accordingly, the internal resistance R can be calculated by $R=(Vc-Vb)/(Ic-Ib)$. Thereby, the internal resistance can be obtained in a short time (for example, approximately 0.1 second) after switching between charging and discharging, so that the internal resistance of the secondary battery can be accurately calculated even when charging and discharging are repeated frequently.

The internal resistance calculation device according to the present embodiment wherein the resistance calculation portion calculates the internal resistance of the secondary battery when the current obtained by the current obtaining portion after the waiting time identified by the identification portion is higher than a predetermined threshold value.

When the current obtained by the current obtaining portion after the waiting time T identified by the identification portion is higher than a predetermined threshold value, the resistance calculation portion calculates the internal resistance of the secondary battery. When the current obtained after the elapse of the waiting time T to calculate the internal resistance is low, since the internal resistance cannot be calculated accurately, a condition of being a case where the current is higher than the predetermined threshold value is added, whereby the accuracy of calculation of the internal resistance can be increased.

The internal resistance calculation device according to the present embodiment includes a current integration value calculation portion that calculates a current integration value during a time from a time point when the switching determination portion determines that switching between charging and discharging is present to the elapse of the waiting time identified by the identification portion, based on the current obtained by the current obtaining portion, wherein the resistance calculation portion calculates the internal resistance of the secondary battery when the current integration value calculated by the current integration value calculation portion is higher than a predetermined lower limit value.

The current integration value calculation portion calculates the current integration value during the time from the time point when the switching determination portion determines that switching between charging and discharging is present to the elapse of the waiting time T identified by the identification portion, based on the current obtained by the current obtaining portion. The "time point when the switching determination portion determines" may be the time point of the next sampling after the occurrence of switching between charging and discharging. For example, when the time point when switching between charging and discharging occurs is t2, the time point of the first sampling after the time point t2 is t3 and the time point when the waiting time T elapses from the time point t3 (which may be the time point t2) is t4, the current integration value can be calculated based on the total value of the current values sampled during the time from the time point t3 to the time point t4.

When the current integration value calculated by the current integration value calculation portion is higher than a predetermined lower limit value, the resistance calculation portion calculates the internal resistance of the secondary battery. The predetermined lower limit value can be calculated, for example, by the predetermined threshold value Ith×the waiting time T×a required coefficient α (α is, for example, $0.5 \leq \alpha$). Here, the predetermined threshold value Ith is a threshold value used when whether to calculate the internal resistance of the secondary battery or not is determined based on the current after the elapse of the waiting time.

In a case where after switching between charging and discharging, the current value of the secondary battery transitions among comparatively low values and exceeds the predetermined threshold value Ith immediately before the elapse of the waiting time T, there are cases where the current of the secondary battery cannot be said to be in a sufficiently stable state. Accordingly, the provision of the condition that the current integration value from switching between charging and discharging to the elapse of the waiting time T is higher than the lower limit value can eliminate a condition where the current value of the secondary battery is not in a sufficiently stable state such that it transitions among comparatively low values and increases immediately before the elapse of the waiting time T, so that the accuracy of calculation of the internal resistance can be further improved.

The internal resistance calculation device according to the present embodiment includes a current integration value calculation portion that calculates an after-switching current integration value during a time from the time point when the switching determination portion determines that switching between charging and discharging is present to the elapse of the waiting time identified by the identification portion and a before-switching current integration value during a time from a before-switching time point, the waiting time prior to the above-mentioned time point, to the above-mentioned time point, based on the current obtained by the current obtaining portion, wherein the resistance calculation portion calculates the internal resistance of the secondary battery when a difference between the after-switching current integration value and the before-switching current integration value is not more than a predetermined difference threshold value.

Based on the current obtained by the current obtaining portion, the current integration value calculation portion calculates an after-switching current integration value during the time from the time point when the switching determination portion determines that switching between charging and discharging is present to the elapse of the waiting time T identified by the identification portion and a before-switching current integration value during the time from a before-switching time point, the waiting time T prior to the time point when the determination is made, to the time point when the determination is made. The "time point when the switching determination portion determines" may be the time point of the next sampling after the occurrence of switching between charging and discharging. For example, when the time point when switching between charging and discharging occurs is t2, the time point of the first sampling after the time point t2 is t3, the time point when the waiting time T elapses from the time point t3 (which may be the time point t2) is t4 and the before-switching time point the waiting time T prior to the time point t3 (which may be the time point t2) is t1, the after-switching current integration value can be calculated based on the total value of the current values sampled during the time from the time point t3 to the time point t4, and the before-switching current integration value can be calculated based on the total value of the current values sampled during the time from the time point t1 to a time point (t3-1). Here, the time point (t3-1) is the sampling time point immediately preceding the sampling time point t3.

When the difference between the after-switching current integration value and the before-switching current integration value is not more than the predetermined difference threshold value, the resistance calculation portion calculates the internal resistance of the secondary battery. The predetermined difference threshold value can be calculated, for example, by the predetermined threshold value Ith×the waiting time T×a required coefficient β (β is, for example, $0.1 \leq \beta \leq 2$). Here, the predetermined threshold value Ith is a threshold value used when whether to calculate the internal resistance of the secondary battery or not is determined based on the current after the elapse of the waiting time T.

Even in a case where after switching between charging and discharging, the current value of the secondary battery transitions comparatively stably and the current after the elapse of the waiting time T is higher than the predetermined threshold value Ith, when the current value of the secondary battery before switching between charging and discharging transitions among low values or when it transitions among high values, there are cases where the condition of the charge transfer of the secondary battery is different between before and after switching between charging and discharging. Accordingly, the provision of the condition that the difference between the current integration values before and after charging and discharging is not more than the predetermined difference threshold value can eliminate a condition where the charge movement tendency is different such that the difference in the current value of the secondary battery between before and after charging and discharging increases, so that the accuracy of calculation of the internal resistance can be further improved.

The internal resistance calculation device according to the present embodiment wherein the resistance calculation portion does not calculate the internal resistance of the secondary battery when the time point when the switching determination portion determines that switching between charging and discharging is present is within a predetermined time from the time point when it is most recently determined that switching between charging and discharging is present.

When the time point when the switching determination portion determines that switching between charging and discharging is present is within a predetermined time from the time point when it is most recently determined that switching between charging and discharging is present, the resistance calculation portion does not calculate the internal resistance of the secondary battery. While the predetermined time may be, for example, 50 ms, it is not limited thereto. For example, in a case where switching between charging and discharging currents occurs such that switching from charging to discharging is made when the charging current is flowing, discharging current flows, switching to charging is made within a predetermined time (in a comparatively short time) and charging current flows, since the accuracy of calculation of the internal resistance of the secondary battery is degraded, the internal resistance of the secondary battery is not calculated. Thereby, a low-accuracy internal resistance value can be prevented from being calculated.

The internal resistance calculation device according to the present embodiment includes a current change degree calculation portion that calculates a current change degree based on the current obtained by the current obtaining portion, wherein the resistance calculation portion does not calculate the internal resistance of the secondary battery when the current change degree calculated by the current change degree calculation portion is higher than a predetermined change degree threshold value during the time from the time point when the switching determination portion determines that switching between charging and discharging is present to the elapse of the waiting time identified by the identification portion.

The current change degree calculation portion calculates the current change degree based on the current obtained by the current obtaining portion. For example, in a case where the current is obtained at predetermined sampling intervals, when the difference between the current obtained at the latest sampling time point and the current obtained at the most recent (last) sampling time point is ΔI and the sampling interval is Δts, the current change degree can be calculated, for example, by an expression ΔI/Δts.

The resistance calculation portion does not calculate the internal resistance of the secondary battery when the change degree calculated by the current change degree calculation portion is higher than a predetermined change degree threshold value during the time from the time point when the switching determination portion determines that switching between charging and discharging is present to the elapse of the waiting time T identified by the identification portion. For example, when the time point when switching between charging and discharging occurs is t2 and the time point when the waiting time T elapses is t4, the internal resistance of the secondary battery is not calculated when the current change degree based on the current obtained by performing sampling during the time after the time point t2 to the time point t4 is higher than the predetermined change degree threshold value.

Even in a case where the current after the elapse of the waiting time T is higher than the predetermined threshold value Ith, when the current change degree increases during the time after switching between charging and discharging to the elapse of the waiting time T, there is a possibility that the internal resistance of the secondary battery cannot be calculated accurately. Accordingly, when the current change degree is higher than the predetermined change degree threshold value during the time from when it is determined that switching between charging and discharging is present to the elapse of the waiting time T, by not calculating the internal resistance of the secondary battery, the calculation accuracy of the secondary battery can be prevented from decreasing.

The internal resistance calculation device according to the present embodiment wherein the identification portion further identifies the waiting time based on a state of charge of the secondary battery.

The identification portion further identifies the waiting time based on the state of charge (SOC) of the secondary battery. As the state of charge (SOC) decreases, the boundary frequency range decreases, and the waiting time T inversely proportional to the frequency f in the boundary frequency range increases. Accordingly, for example, a correction coefficient K1 corresponding to the state of charge is determined, and the final waiting time is identified by correcting the waiting time according to the state of charge of the secondary battery. Thereby, the internal resistance can be accurately calculated irrespective of the state of charge of the secondary battery.

The internal resistance calculation device according to the present embodiment includes a temperature obtaining portion that obtains a temperature of the secondary battery, wherein the identification portion identifies the waiting time based on the temperature obtained by the temperature obtaining portion.

The temperature obtaining portion obtains the temperature of the secondary battery. The identification portion further identifies the waiting time based on the temperature obtained by the temperature obtaining portion. As the temperature of the secondary battery decreases, the boundary frequency range decreases, and the waiting time T inversely proportional to the frequency f in the boundary frequency range increases. Accordingly, for example, when a correction coefficient K2 corresponding to the temperature of the secondary battery is determined and the final waiting time is identified by correcting the waiting time according to the temperature of the secondary battery. Thereby, the internal resistance can be accurately calculated irrespective of the temperature of the secondary battery.

The internal resistance calculation device according to the present embodiment includes an open voltage calculation portion that calculates an open voltage of the secondary battery based on the internal resistance calculated by the resistance calculation portion, the voltage obtained by the voltage obtaining portion and the current obtained by the current obtaining portion; and a state of charge calculation portion that calculates the state of charge of the secondary battery based on the open voltage calculated by the open voltage calculation portion.

The open voltage calculation portion calculates the open voltage of the secondary battery based on the internal resistance R calculated by the resistance calculation portion, the voltage V obtained by the voltage obtaining portion and the current I obtained by the current obtaining portion. When the open voltage of the secondary battery is OCV, it can be calculated by OCV=V−Vo. Here, Vo is an overvoltage, and is a voltage obtained by adding a polarizing voltage to a voltage expressed by the internal resistance R×the current I.

The state of charge calculation portion calculates the state of charge of the secondary battery based on the open voltage calculated by the open voltage calculation portion. For example, by predetermining the correlation between the open voltage OCV and the state of charge (SOC) of the secondary battery, the state of charge of the secondary battery can be calculated based on the calculated open voltage.

The internal resistance calculation device according to the present embodiment includes a deterioration degree calculation portion that calculates a deterioration degree of the secondary battery based on a ratio of the internal resistance calculated by the resistance calculation portion to an initial value of the internal resistance of the secondary battery.

The deterioration degree calculation portion calculates the deterioration degree (SOH) of the secondary battery based on the ratio of the internal resistance R calculated by the resistance calculation portion to an initial value R0 of the internal resistance of the secondary battery. By predetermining the correlation between the increase rate of the internal resistance and the discharge capacity ratio (deterioration degree) and identifying the discharge capacity ratio corresponding to the ratio R/R0 of the internal resistance, the deterioration degree (SOH) can be calculated.

First Embodiment

Hereinafter, description will be given based on the drawings showing an embodiment of the internal resistance calculation device according to the present invention. FIG. 1 is a block diagram showing an example of the structure of a relevant part of a vehicle mounted with a battery monitoring device 100 as the internal resistance calculation device of the present embodiment. As shown in FIG. 1, the vehicle is provided with a secondary battery unit 50, relays 61 and 63, a generator (ALT) 62, a starter motor (ST) 64, a battery 65, an electric load 66 and the like in addition to the battery monitoring device 100.

The secondary battery unit 50 is, for example, a lithium-ion battery, and a plurality of cells 51 are connected in series or in series and parallel. The secondary battery unit 50 is provided with a voltage sensor 52, a current sensor 53 and a temperature sensor 54. The voltage sensor 52 detects the voltage of each cell 51 and the voltage across the secondary battery unit 50, and outputs the detected voltages to the battery monitoring device 100 through a voltage detection line 50a. The current sensor 53 is formed of, for example, a shunt resistance or a Hall sensor, and detects the charging current and the discharging current of the secondary battery. The current sensor 53 outputs the detected current to the battery monitoring device 100 through a current detection line 50b. The temperature sensor 54 is formed of, for example, a thermistor, and detects the temperatures of the cells 51. The temperature sensor 54 outputs the detected temperatures to the battery monitoring device 100 through a temperature detection line 50c.

The battery 65, which is, for example, a lead battery, supplies power to the electric load 66 of the vehicle when the relay 63 is on, supplies power for driving the starter motor 64. The generator 62 generates power by the rotation of the engine of the vehicle, and outputs a direct current by an internally provided rectification circuit to charge the battery 65. Moreover, the generator 62 charges the battery 65 and the secondary battery unit 50 when the relay 61 is on. Turning on and off of the relays 61 and 63 is performed by a non-illustrated relay control portion.

Figure 2:
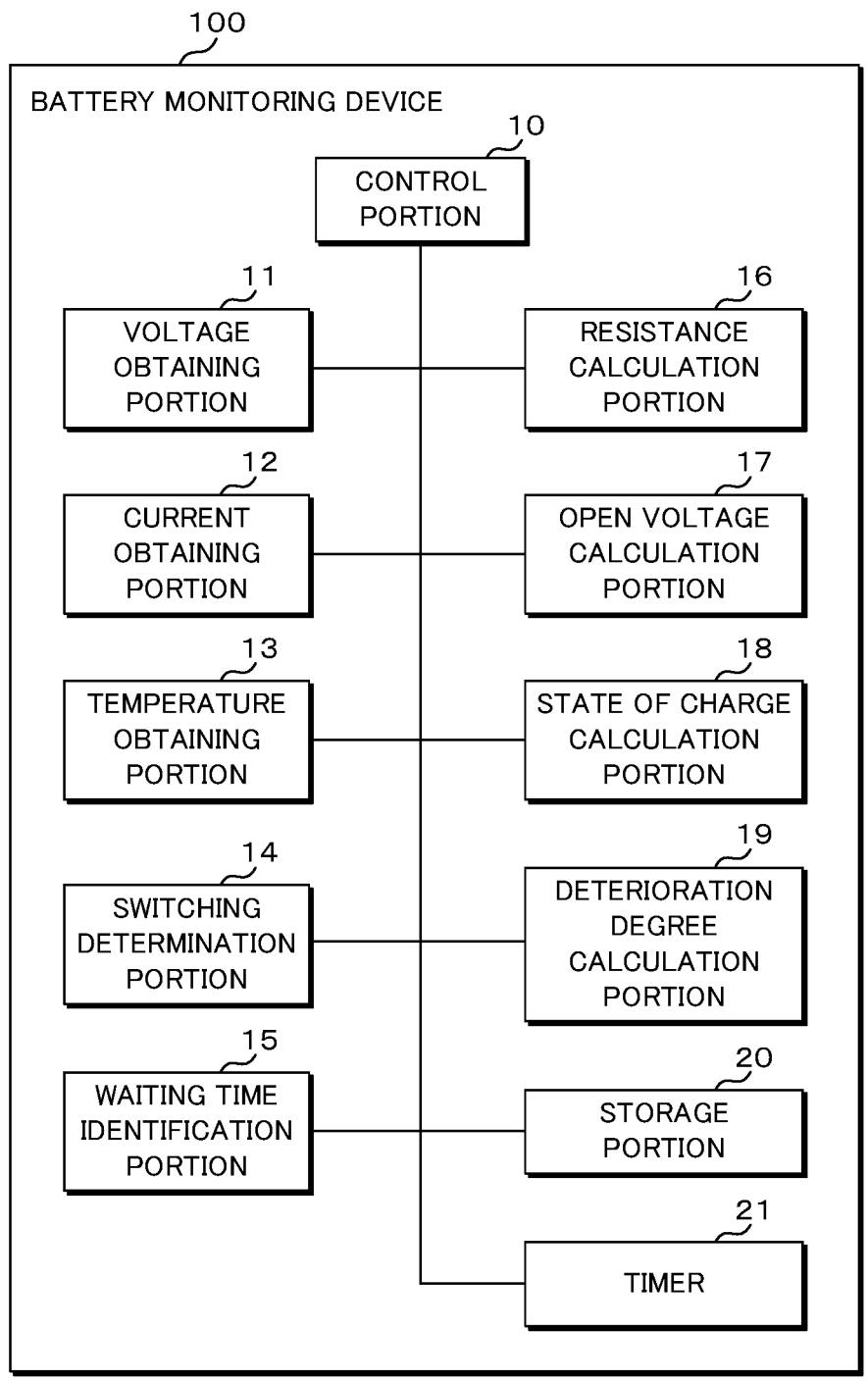
FIG. 2 A block diagram showing an example of the structure of the battery monitoring device as the internal resistance calculation device of the present embodiment.

FIG. 2 is a block diagram showing an example of the structure of the battery monitoring device 100 as the internal resistance calculation device of the present embodiment. The battery monitoring device 100 is provided with a control portion 10 controlling the entire device, a voltage obtaining portion 11, a current obtaining portion 12, a temperature obtaining portion 13, a switching determination portion 14, a waiting time identification portion 15, a resistance calculation portion 16, an open voltage calculation portion 17, a state of charge calculation portion 18, a deterioration degree calculation portion 19, a storage portion 20, a timer 21 for clocking and the like.

The voltage obtaining portion 11 obtains the voltage of the secondary battery unit 50 (for example, the voltage across the secondary battery unit 50). Moreover, the current obtaining portion 12 obtains the currents (the charging current and the discharging current) of the secondary battery unit 50. The frequency of the voltage and current obtaining and the sampling frequency of the obtaining may be controlled by the control portion 10.

The switching determination portion 14 determines the presence or absence of switching between charging and discharging of the secondary battery unit 50 based on the current obtained by the current obtaining portion 12. For example, when the current obtained by the current obtaining portion 12 in the case of charging is defined as positive, since the direction of the current is opposite between charging and discharging, a case where the current obtained by the current obtaining portion 12 is negative can be determined as discharging. That is, one of charging and discharging is defined as positive, and it can be determined that switching between charging and discharging is present when the current changes from positive to negative or to 0, when the current changes from 0 to positive or to negative or when the current changes from negative to positive or to 0.

The waiting time identification portion 15 has a function as an identification portion, and identifies the waiting time based on a boundary frequency range in which the diffusion impedance arising from the process of diffusion of a predetermined ion contributes to the impedance of the secondary battery unit 50 in the impedance spectrum of the secondary battery unit 50. The impedance spectrum, which is also called Cole-Cole plot or Nyquist plot, is a plot of values obtained by measuring the impedance of the secondary battery unit 50 at a plurality of frequencies by using an AC impedance method. Moreover, the predetermined ion is lithium (Li) ion. The boundary frequency range means providing the frequency with a required width, and means that there is no limitation to a frequency at one point.

Figure 3:
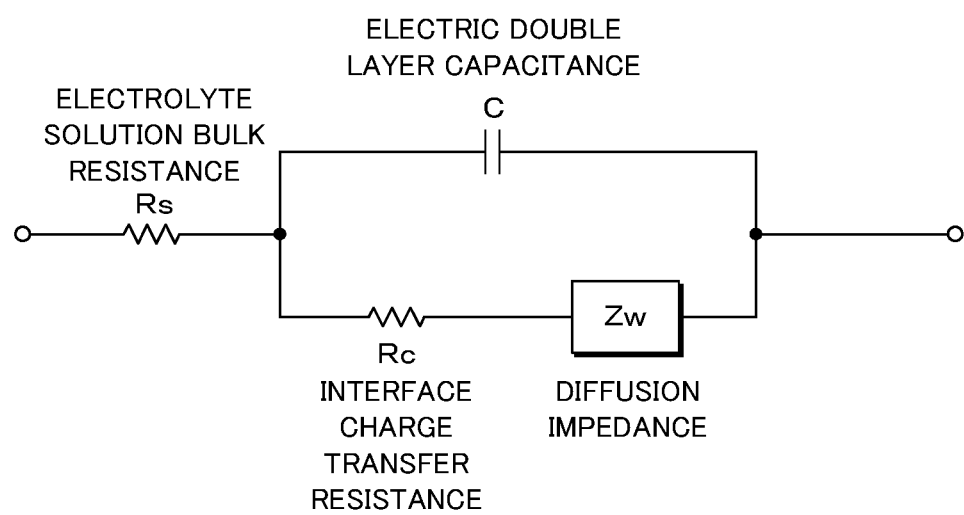
FIG. 3 An explanatory view showing an example of an equivalent circuit of a secondary battery unit of the present embodiment.

FIG. 3 is an explanatory view showing an example of an equivalent circuit of the secondary battery unit 50 of the present embodiment. The secondary battery unit 50 can be expressed by an equivalent circuit formed of an electrolyte solution bulk resistance Rs, an interface charge transfer resistance Rc, an electric double layer capacitance C and a diffusion impedance Zw. More specifically, the impedance of the secondary battery unit 50 can be equivalently expressed by a circuit in which the electrolyte solution bulk resistance Rs is further connected in series to a circuit where the electric double layer capacitance C is parallel-connected to a series circuit of the interface charge transfer resistance Rc and the diffusion impedance Zw.

The electrolyte solution bulk resistance Rs includes a conductivity resistance of lithium (Li) ion in an electrolyte solution, an electronic resistance at the positive electrode and the negative electrode and the like. The interface charge transfer resistance Rc includes a charge transfer resistance, a film resistance and the like on an active material surface. The diffusion impedance Zw is an impedance arising from the process of diffusion of lithium (Li) ion into an active material particle.

Figure 4:
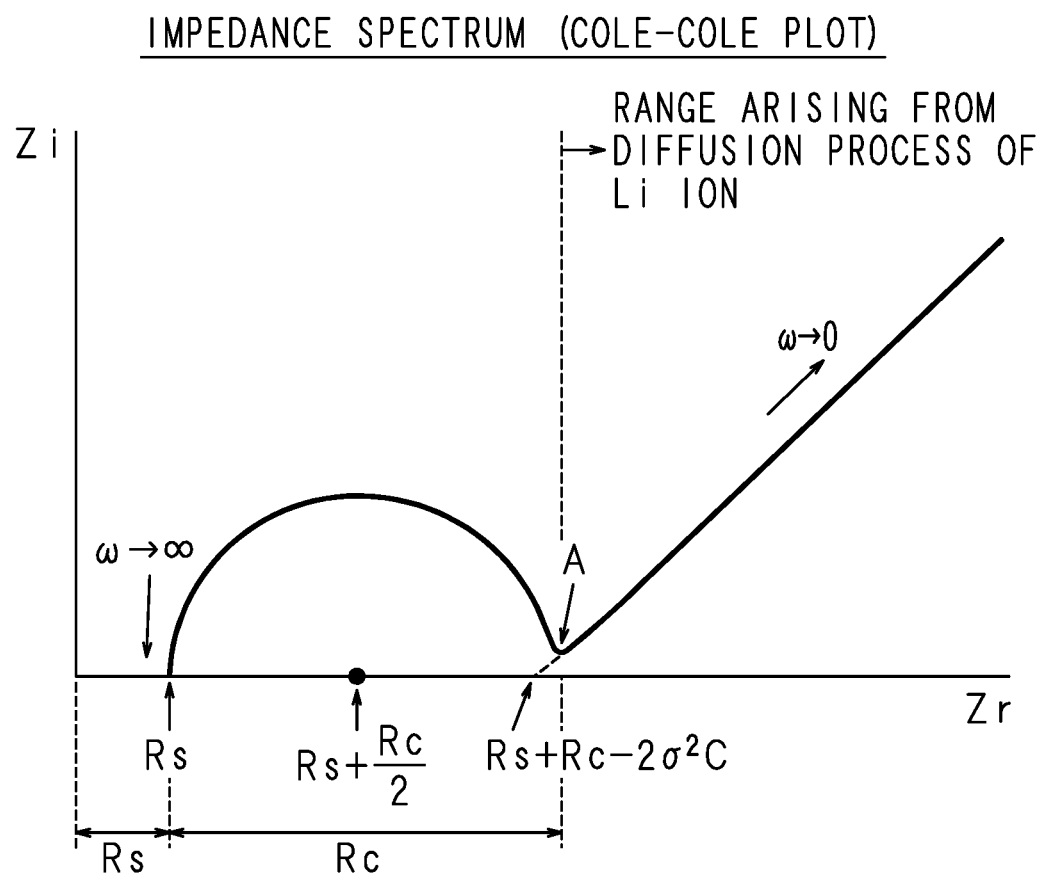
FIG. 4 An explanatory view showing an example of the impedance spectrum of the secondary battery unit of the present embodiment.

FIG. 4 is an explanatory view showing an example of the impedance spectrum of the secondary battery unit 50 of the present embodiment. In FIG. 4, the horizontal axis represents a real number component Zr of an impedance Z, and the vertical axis represents an imaginary number component Zi of the impedance Z. Regarding the internal resistance of the secondary battery unit 50, the electrolyte solution bulk resistance Rs and the interface charge transfer resistance Rc constitute a main part thereof. On the other hand, when the frequency in the AC impedance method is changed from a high frequency to a low frequency (for example, from 100 kHz to 0.01 mHz, or 1 MHz to 10 µHz), as shown in FIG. 4, in a certain frequency range (referred to as boundary frequency range: the neighborhood shown by reference designation A in FIG. 4), the diffusion impedance Zw increases, and the impedance of the secondary battery unit 50 increases (contributes to the impedance of the secondary battery). That is, that the diffusion impedance arising from the process of diffusion of the predetermined ion contributes to the impedance of the secondary battery unit 50 in the impedance spectrum of the secondary battery unit 50 means that when the frequency (or the angular frequency) decreases from a high frequency to a low frequency, the diffusion impedance Zw increases and the impedance of the secondary battery unit 50 increases. That is, the boundary frequency range means a frequency range in which the impedance of the secondary battery unit 50 can be expressed by the total value of the electrolyte solution bulk resistance Rs and the interface charge transfer resistance Rc and the influence (contribution) by the diffusion impedance Zw is small or of a degree that can be ignored. In the AC impedance method, an AC voltage the frequency of which is changed to identify the elements of the equivalent circuit of the secondary battery unit 50 is applied to the secondary battery unit 50 and the current signal and the voltage signal obtained from the secondary battery unit 50 is transformed into a frequency range by discrete Fourier transform, thereby obtaining the impedance.

When the frequency of the AC voltage is f, the impedance Z of the secondary battery unit 50 can be expressed by expression (1). Here, w is the angular frequency, and σ is a constant related to the diffusion condition.

$$Z = Rs + \frac{1}{jwC + \frac{1}{Rc + \frac{(1-j)\sigma}{\omega^{\frac{1}{2}}}}} \quad (1)$$

$$Zr = Rs + \frac{Rc + \frac{\sigma}{\omega^{\frac{1}{2}}}}{\left(C \cdot \sigma \cdot \omega^{\frac{1}{2}} + 1\right)^2 + \omega^2 C^2 \left(Rc + \frac{\sigma}{\omega^{\frac{1}{2}}}\right)^2} \quad (2)$$

$$Zi = \frac{\frac{\sigma}{\omega^{\frac{1}{2}}}\left(C \cdot \sigma \cdot \omega^{\frac{1}{2}} + 1\right) + \omega C \left(Rc + \frac{\sigma}{\omega^{\frac{1}{2}}}\right)^2}{\left(C \cdot \sigma \cdot \omega^{\frac{1}{2}} + 1\right)^2 + \omega^2 C^2 \left(Rc + \frac{\sigma}{\omega^{\frac{1}{2}}}\right)^2} \quad (3)$$

$$Zr = Rs + Rc + \frac{\sigma}{\omega^{\frac{1}{2}}} \quad (4)$$

$$Zi = \frac{\sigma}{\omega^{\frac{1}{2}}} + 2\sigma^2 C \quad (5)$$

$$Zi = Zr - (Rs + Rc - 2\sigma^2 C) \quad (6)$$

$$Z = Rs \quad (7)$$

The impedance expressed by expression (1) which impedance is plotted for each frequency is the impedance spectrum shown in FIG. 4. The real number component Zr of the impedance Z of expression (1) can be expressed by expression (2), and the imaginary number component Zi can be expressed by expression (3). Substituting w=0 into expression (2) and expression (3) in order to obtain the locus in a low frequency domain, expression (4) and expression (5) are obtained. Here, erasing w from expression (4) and expression (5), expression (6) is obtained. On the other hand, in a high frequency domain, when w=∞ in expression (1), expression (7) is obtained.

In FIG. 4, when w=∞, the impedance Z at the point where the locus intersects with the horizontal axis is Z=Zr=Rs. Moreover, the impedance Z at the center of the semicircular locus (the point intersecting with the horizontal axis) is Z=Zr=Rs+Rc/2. Moreover, in FIG. 4, it is apparent that when w is lower than the boundary frequency range shown by reference designation A, the locus of the impedance Z increases linearly. The impedance Z at the point where an extension line which is an extension of such a straight line intersects with the horizontal axis is Z=Zr=Rs+R−2σ²C. A frequency domain smaller than the boundary frequency range shown by reference designation A is a domain arising from the process of diffusion of lithium ion, and the diffusion impedance Zw increases as the frequency decreases.

As mentioned above, regarding the internal resistance R of the secondary battery unit 50, the electrolyte solution bulk resistance Rs and the interface charge transfer resistance Rc constitute a main part thereof. Moreover, when the frequency in the AC impedance method is changed from a high frequency to a low frequency, in the boundary frequency range, the diffusion impedance Zw increases, and the impedance of the secondary battery increases (contributes to the impedance of the secondary battery). Accordingly, it can be said that the impedance Z in the boundary frequency range before the diffusion impedance Zw increases represents the internal resistance R of the secondary battery unit 50.

Moreover, a relationship T=1/(2×f) is present between the frequency f in the AC impedance method and the waiting time T from when the AC current is passed to when measurement is performed. That is, the waiting time T can be identified, for example, from a relationship of being the reciprocal of twice the frequency f. For example, when the frequency f is 5 Hz, the waiting time T is 0.1 second. That the waiting time T is the reciprocal of twice the frequency f is an example; for example, the waiting time T may be the reciprocal of four times the frequency f.

When the switching determination portion 14 determines that switching between charging and discharging is present, the resistance calculation portion 16 calculates the internal resistance R of the secondary battery unit 50 based on the voltage obtained by the voltage obtaining portion 11 and the current obtained by the current obtaining portion 12 after the waiting time T identified by the waiting time identification portion 15.

When switching from charging to discharging or from discharging to charging is made, of the internal resistance R of the secondary battery unit 50, for example, the diffusion resistance (diffusion impedance) and the charge transfer resistance are reset once, and the internal resistance R starts to increase according to the energization time. Accordingly, when it is determined that switching between charging and discharging is present, the internal resistance R of the secondary battery unit 50 can be calculated by obtaining the voltage Vc and the current IC after the waiting time T. Thereby, the internal resistance R can be obtained in a short time (for example, approximately 0.1 second) after switching between charging and discharging, so that the internal resistance R of the secondary battery unit 50 can be accurately calculated in a comparatively short time after switching of charging or discharging even when charging and discharging are repeated frequently.

More specifically, the resistance calculation portion 16 calculates the internal resistance R of the secondary battery based on the voltage Vb obtained by the voltage obtaining portion 11 and the current Ib obtained by the current obtaining portion 12 before the switching determination portion 14 determines that switching between charging and discharging is present and the voltage Vc obtained by the voltage obtaining portion 11 and the current Ic obtained by the current obtaining portion 12 after the waiting time T identified by the waiting time identification portion 15.

The absolute value of the inclination of the straight line obtained from the voltage and current between two points represents the internal resistance R of the secondary battery unit 50. Accordingly, the internal resistance R can be calculated by R=(Vc−Vb)/(Ic−Ib). Thereby, the internal resistance can be obtained in a short time (for example, approximately 0.1 second) after switching between charging and discharging, so that the internal resistance of the secondary battery can be accurately calculated in a comparatively short time after switching of charging or discharging even when charging and discharging are repeated frequently.

Moreover, when the current obtained by the current obtaining portion 12 after the waiting time T identified by the waiting time identification portion 15 is higher than a predetermined threshold value, the resistance calculation portion 16 calculates the internal resistance R of the secondary battery unit 50.

When the current obtained after the elapse of the waiting time T is low, since the internal resistance R cannot be calculated accurately, a condition of being a case where the current is higher than the predetermined threshold value is added, whereby the accuracy of calculation of the internal resistance R can be increased.

Figure 5:
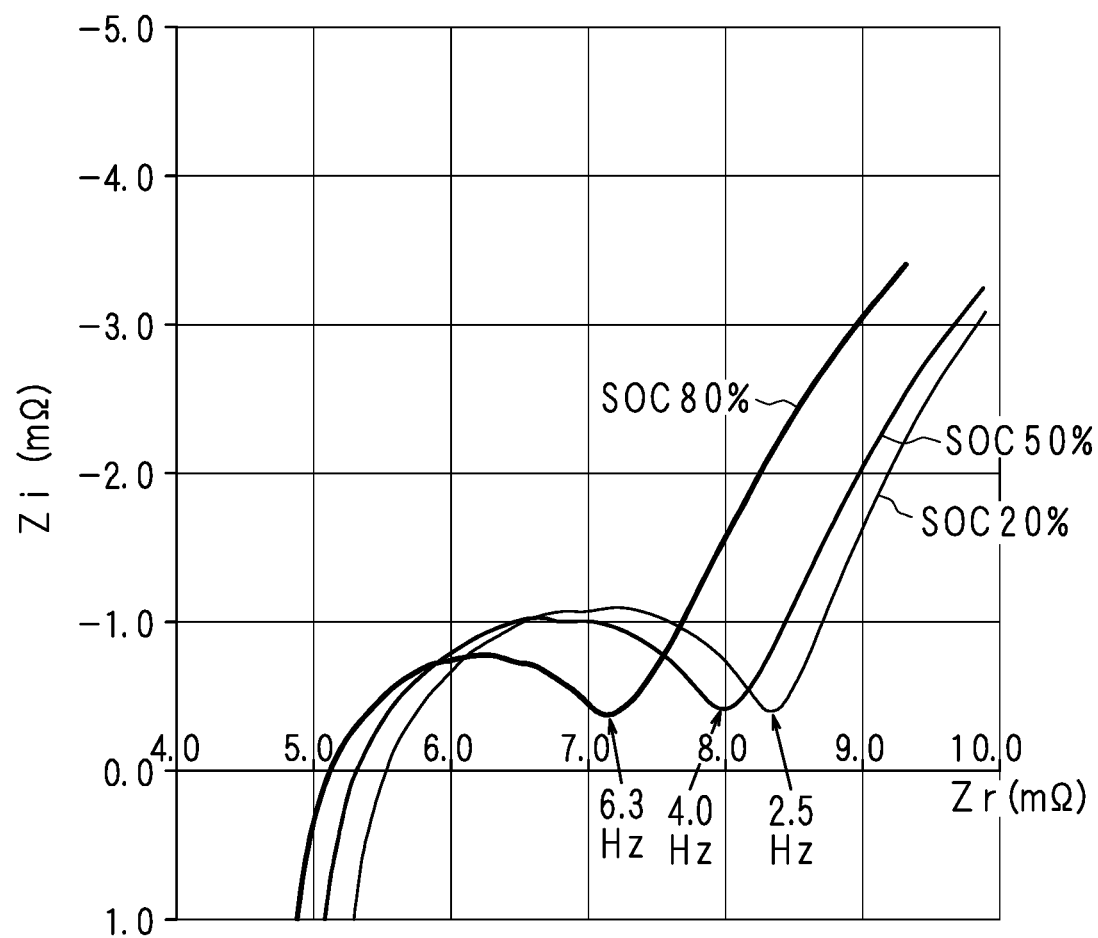
FIG. 5 An explanatory view showing an example of the impedance spectrum when the state of charge of the secondary battery unit of the present embodiment is changed.

FIG. 5 is an explanatory view showing an example of the impedance spectrum when the state of charge of the secondary battery unit 50 of the present embodiment is changed. The example of FIG. 5 shows the impedance spectrum when the state of charge (SOC: state of charge) is changed to 20%, 50% and 80% at 25 degrees C. When the state of charge is changed to 20%, 50% and 80%, for example, the boundary frequency range is changed to 2.5 Hz, 4.0 Hz and 6.3 Hz. It is understood that the impedance of the secondary battery unit 50 increases as the state of charge decreases. The waiting times T corresponding to the boundary frequency ranges 2.5 Hz, 4.0 Hz and 6.3 Hz are 0.2 seconds, 0.125 seconds and 0.079 seconds, respectively.

Figure 6:
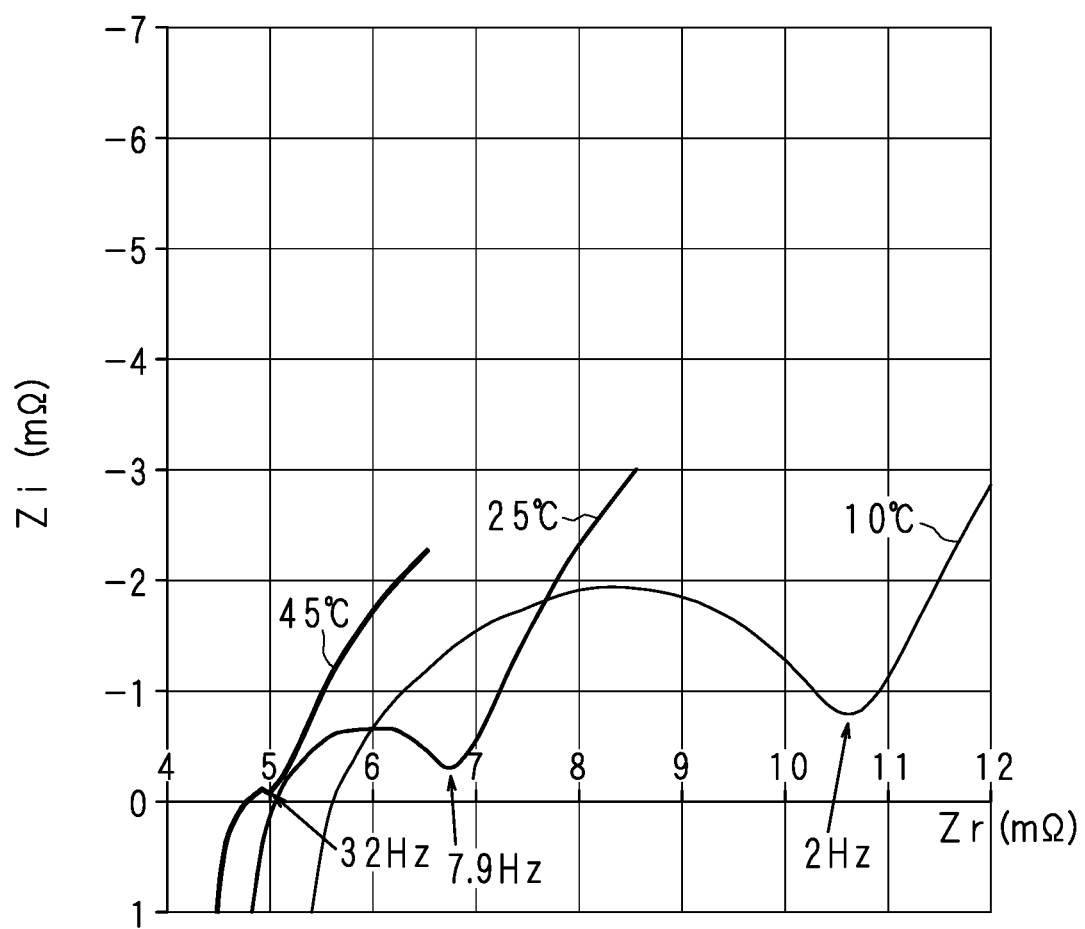
FIG. 6 An explanatory view showing an example of the impedance spectrum when the temperature of the secondary battery unit of the present embodiment is changed.

FIG. 6 is an explanatory view showing an example of the impedance spectrum when the temperature of the secondary battery unit 50 of the present embodiment is changed. The example of FIG. 6 shows the impedance spectrum when the temperature of the secondary battery unit 50 is changed to 10 degrees C., 25 degrees C. and 45 degrees C. with the state of charge being fixed. When the temperature of the secondary battery unit 50 is changed to 10 degrees C., 25 degrees C. and 45 degrees C., for example, the boundary frequency range is changed to 2 Hz, 7.9 Hz and 32 Hz. It is understood that the impedance of the secondary battery unit 50 increases as the temperature of the secondary battery unit 50 decreases. The waiting times T corresponding to the boundary frequency ranges 2 Hz, 7.9 Hz and 32 Hz are 0.25 seconds, 0.063 seconds and 0.015 seconds, respectively.

Figure 7:
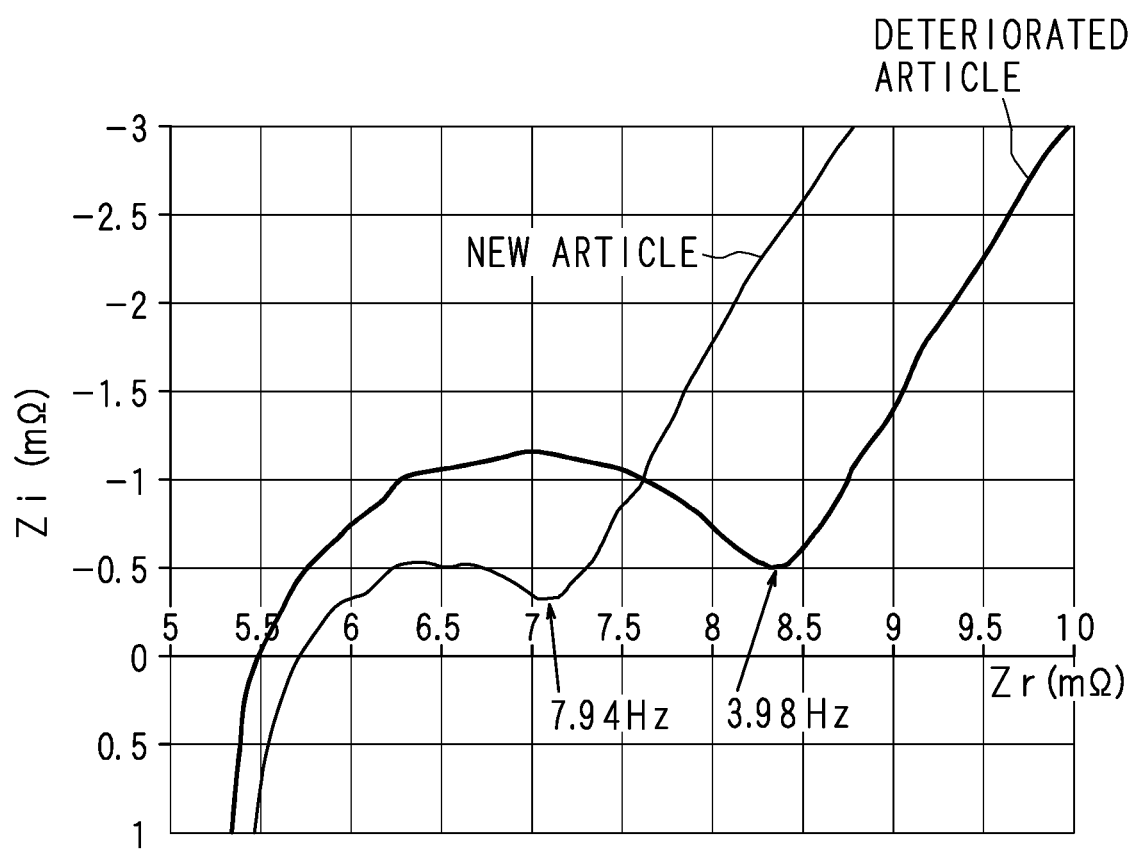
FIG. 7 An explanatory view showing an example of the impedance spectrum of a new article and a deteriorated article of the secondary battery unit of the present embodiment.

FIG. 7 is an explanatory view showing an example of the impedance spectrum of a new article and a deteriorated article of the secondary battery unit 50 of the present embodiment. When the secondary battery unit 50 is a new article, for example, the boundary frequency range is 7.94 Hz, and when it is a deteriorated article, the boundary frequency range is 3.98 Hz. It is understood that the impedance of the secondary battery unit 50 increases as the secondary battery unit 50 deteriorates. Moreover, the waiting times T corresponding to the boundary frequency ranges 3.98 Hz and 7.94 Hz are 0.126 seconds and 0.063 seconds, respectively.

FIG. 8 is an explanatory view showing an example of the waiting time corresponding to the boundary frequency range of the secondary battery unit 50 of the present embodiment. The boundary frequency range is, as illustrated in FIG. 4 and the like described previously, a frequency of the domain where the impedance Z of the secondary battery unit 50 starts to increase with the increase in the diffusion impedance Zw when the angular frequency w (frequency f) decreases from infinity toward 0. The boundary frequency range can be made a frequency range having, for example, a width of ±50% with respect to a reference frequency. For example, that the boundary frequency range is 4 Hz may include a frequency range of ±50% of a reference frequency of 4 Hz. Converting the boundary frequency range into the waiting time T, a boundary frequency range of 4 Hz is a waiting time of 0.125 seconds, and the time of ±50% with respect to 0.125 seconds can be made the waiting time T corresponding to the boundary frequency range. In this case, a waiting time of 0.125 seconds may include a range of 0.0625 seconds to 0.187 seconds. Moreover, from the example of FIG. 8, the state of charge (SOC) range can be covered by providing the waiting time with a width of ±50%.

The waiting time identification portion 15 identifies the waiting time based on the state of charge (SOC) of the secondary battery unit 50. As illustrated in FIG. 5, as the state of charge (SOC) decreases, the boundary frequency range decreases, and the waiting time T inversely proportional to the frequency f in the boundary frequency range increases.

Accordingly, for example, when a correction coefficient K0 corresponding to the state of charge is determined and the waiting time in a case where the state of charge is 50% is T0, the final waiting time T is calculated by an expression T=K0×T0. Thereby, the final waiting time T can be identified by correcting the waiting time according to the state of charge of the secondary battery unit 50, so that the internal resistance R can be accurately calculated irrespective of the state of charge of the secondary battery unit 50. The correction coefficient K0 corresponding to the state of charge may be stored in the storage portion 20 or may be calculated by an arithmetic circuit.

The temperature obtaining portion 13 obtains the temperature of the secondary battery unit 50. The waiting time identification portion 15 identifies the waiting time T based on the temperature obtained by the temperature obtaining portion 13. As illustrated in FIG. 6, as the temperature of the secondary battery unit 50 decreases, the boundary frequency range decreases, and the waiting time T inversely proportional to the frequency fn the boundary frequency range increases.

Accordingly, for example, when a correction coefficient K1 corresponding to the temperature of the secondary battery unit 50 is determined and the waiting time in a case where the temperature is 25 degrees C. is T0, the final waiting time T is calculated by an expression T=K1×T0. Thereby, the final waiting time T can be identified by correcting the waiting time according to the temperature of the secondary battery unit 50, so that the internal resistance R can be accurately calculated irrespective of the temperature of the secondary battery unit 50. The correction coefficient K1 corresponding to the temperature may be stored in the storage portion 20 or may be calculated by an arithmetic circuit.

Moreover, the waiting time identification portion 15 can identify the waiting time T based on the deterioration degree of the secondary battery unit 50. As illustrated in FIG. 7, as the secondary battery unit 50 deteriorates, the boundary frequency range decreases, and the waiting time T inversely proportional to the frequency fn the boundary frequency range increases.

Accordingly, for example, when a correction coefficient K2 corresponding to the progress of deterioration of the secondary battery unit 50 is determined and the waiting time in the case of a new article is T0, the waiting time T of the deteriorated article is calculated by an expression T=K2×T0. Thereby, the final waiting time T can be identified by correcting the waiting time according to the deterioration of the secondary battery unit 50, so that the internal resistance R can be accurately calculated irrespective of the deterioration of the secondary battery unit 50. The correction coefficient K2 corresponding to the deterioration may be stored in the storage portion 20 or may be calculated by an arithmetic circuit.

The open voltage calculation portion 17 calculates the open voltage of the secondary battery unit 50 based on the internal resistance R calculated by the resistance calculation portion 16, the voltage V obtained by the voltage obtaining portion 11 and the current I obtained by the current obtaining portion 12. When the open voltage of the secondary battery is OCV, it can be calculated by OCV=V−Vo. Here, Vo is an overvoltage, and is a voltage obtained by adding a polarizing voltage to a voltage expressed by the internal resistance R×the current I.

Figure 9:
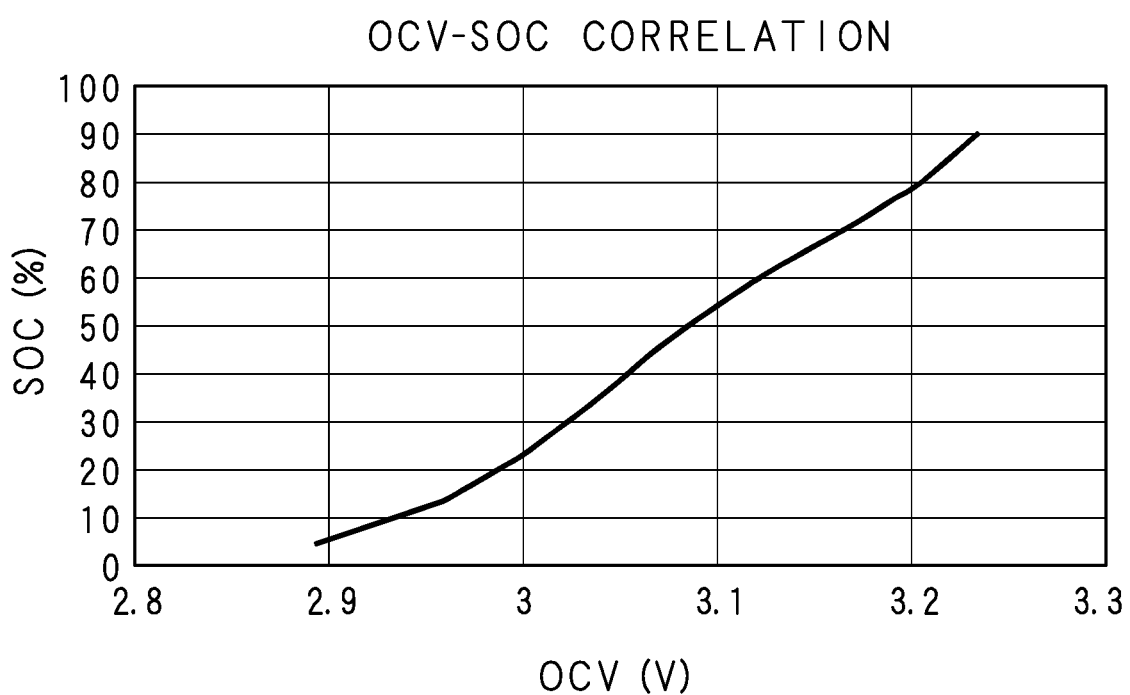
FIG. 9 An explanatory view showing an example of a correlation between the open voltage and the state of charge of the secondary battery unit of the present embodiment.

FIG. 9 is an explanatory view showing an example of a correlation between the open voltage and the state of charge of the secondary battery unit 50 of the present embodiment. In FIG. 9, the horizontal axis represents the open voltage (OCV), and the vertical axis represents the state of charge (SOC). As shown in FIG. 9, the state of charge increases as the open voltage of the secondary battery unit 50 increases. The correlation between the open voltage and the state of charge illustrated in FIG. 9 may be stored in the storage portion 20 or may be calculated by an arithmetic circuit.

The state of charge calculation portion 18 calculates the state of charge of the secondary battery unit 50 based on the open voltage calculated by the open voltage calculation portion 17. As mentioned above, by predetermining the correlation between the open voltage OCV and the state of charge (SOC) of the secondary battery unit 50, the state of charge of the secondary battery unit 50 can be calculated based on the calculated open voltage.

The deterioration degree calculation portion 19 calculates the deterioration degree (SOW of the secondary battery based on the ratio of the internal resistance R calculated by the resistance calculation portion 16 to an initial value R0 of the internal resistance of the secondary battery unit 50.

Figure 10:
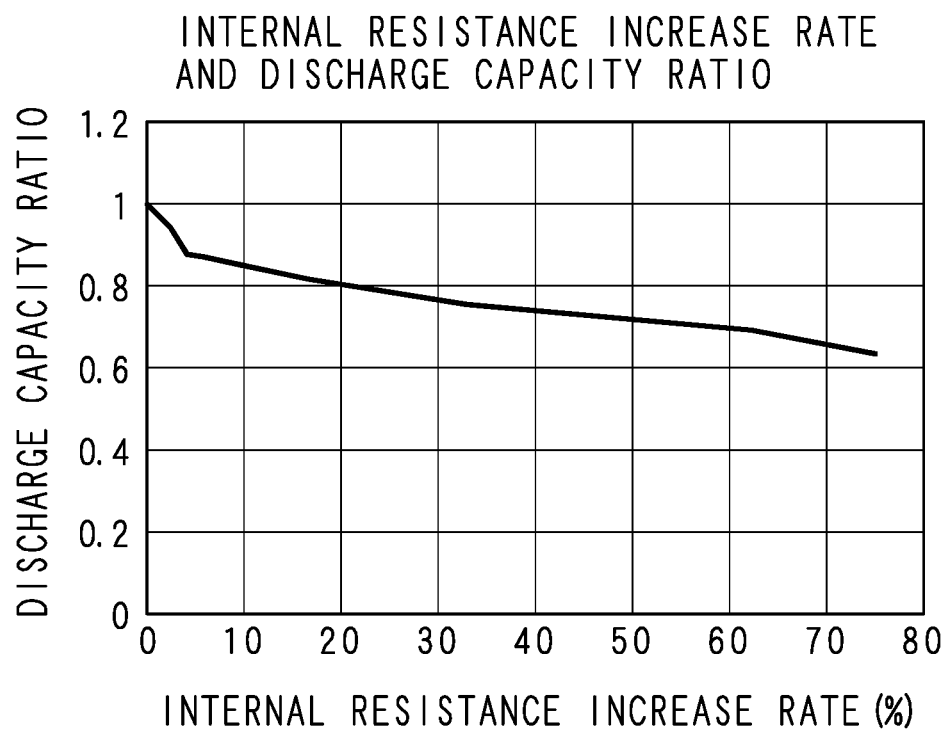
FIG. 10 An explanatory view showing an example of a correlation between the internal resistance increase rate and the discharge capacity ratio of the secondary battery unit of the present embodiment.

FIG. 10 is an explanatory view showing an example of a correlation between the internal resistance increase rate and the discharge capacity ratio of the secondary battery unit 50 of the present embodiment. In FIG. 10, the horizontal axis represents the internal resistance increase rate, and the vertical axis represents the discharge capacity ratio. Moreover, the temperature is 25 degrees C. and the state of charge is 50%. The capacity decline of the secondary battery unit 50 also has a correlation with deterioration, and when the discharge capacity ratio is 1, the deterioration degree can be made zero, and the deterioration degree increases as the discharge capacity ratio decreases. As shown in FIG. 10, as the internal resistance increase rate of the secondary battery unit 50 increases, the discharge capacity ratio decreases and the deterioration degree (SOH) increases. The correlation between the internal resistance increase rate and the discharge capacity ratio illustrated in FIG. 10 may be stored in the storage portion 20 or may be calculated by an arithmetic circuit.

As mentioned above, by predetermining the correlation between the increase rate of the internal resistance R and the discharge capacity ratio (deterioration degree) and identifying the discharge capacity ratio corresponding to the ratio R/R0 of the internal resistance, the deterioration degree (SOH) can be calculated.

Figure 11:
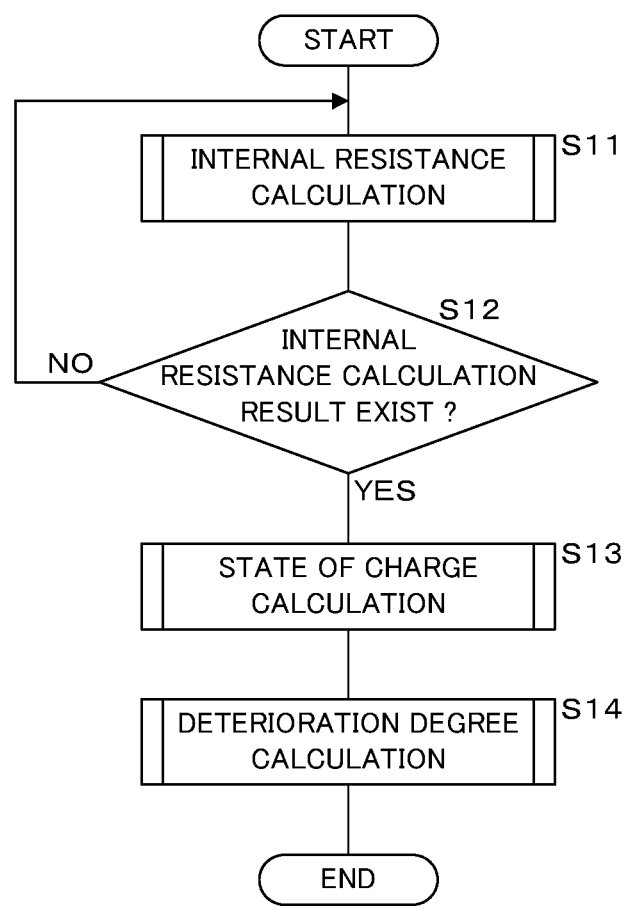
FIG. 11 A flowchart showing an example of the processing procedure of the battery monitoring device of the present embodiment.

Next, the operation of the battery monitoring device 100 of the present embodiment will be described. FIG. 11 is a flowchart showing an example of the processing procedure of the battery monitoring device 100 of the present embodiment. In the following, for convenience' sake, description will be given with the control portion 10 as the portion mainly performing the processing. The control portion 10 performs internal resistance calculation processing (S11). Details of the internal resistance calculation processing will be described later.

The control portion 10 determines the presence or absence of the result of calculation of the internal resistance (S12), and when there is no result of calculation of the internal resistance (NO at S12), the processing of S11 is continued. When there is a result of calculation of the internal resistance (YES at S12), the control portion 10 performs state of charge calculation processing (S13), and performs deterioration degree calculation processing (S14). Details of the state of charge calculation processing and the deterioration degree calculation processing will be described later.

Figure 12:
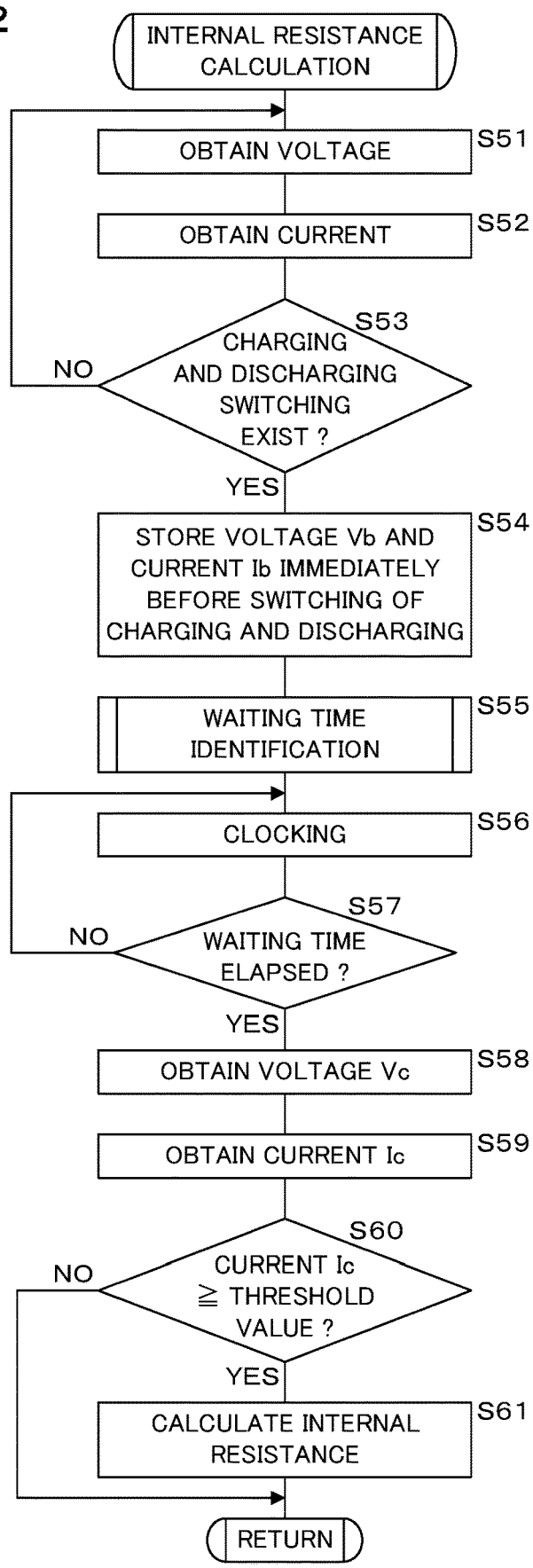
FIG. 12 A flowchart showing an example of the procedure of internal resistance calculation processing of the battery monitoring device of the present embodiment.

FIG. 12 is a flowchart showing an example of the procedure of the internal resistance calculation processing of the battery monitoring device 100 of the present embodiment. The control portion 10 obtains the voltage of the secondary battery (S51), and obtains the current of the secondary battery (S52). The control portion 10 determines the presence or absence of switching between charging and discharging based on the obtained current (S53). The determination as to the presence or absence of switching between charging and discharging may be performed as follows: When a first condition is that the current value obtained most recently (last time)>0 and the latest current value≤0, a second condition is that the current value obtained most recently (last time)=0 and the latest current value≠0 and a third condition is that the current value obtained most recently (last time)<0 and the latest current value≥0, it is determined that switching between charging and discharging is present when any one of the first to third conditions is satisfied.

When switching between charging and discharging is absent (NO at S53), the control portion 10 continues the processing of step S51 and succeeding steps. When switching between charging and discharging is present (YES at S53), the control portion 10 stores the voltage Vb and the current Ib obtained immediately before the switching between charging and discharging into the storage portion 20 (S54).

The control portion 10 performs the waiting time identification processing (S55). Details of the waiting time identification processing will be described later.

The control portion 10 performs clocking (S56). The start time point of the clocking may be the time point when it is determined that switching between charging and discharging is present (the time point when the above-mentioned latest voltage and current are obtained) or may be the time point when the most recent (last) voltage and current are obtained. The control portion 10 determines whether the waiting time has elapsed or not (S57), and when the waiting time has not elapsed (NO at S57), the processing of step S56 and succeeding steps is continued.

When the waiting time has elapsed (YES at S57), the control portion 10 obtains the voltage Vc of the secondary battery (S58), and obtains the current Ic of the secondary battery (S59). The control portion 10 determines whether the obtained current IC is not less than a predetermined threshold value or not (S60). The threshold value may be a value of an extent necessary for accurately calculating the internal resistance.

When the obtained current Ic is not less than the predetermined threshold value (YES at S60), the control portion 10 calculates the internal resistance (S61), and ends the processing. The internal resistance R can be calculated, for example, by R=(Vc−Vb)/(Ic−Ib). When the obtained current Ic is not not less than the predetermined threshold value (NO at S60), the control portion 10 ends the processing without performing the processing of step S61.

Figure 13:
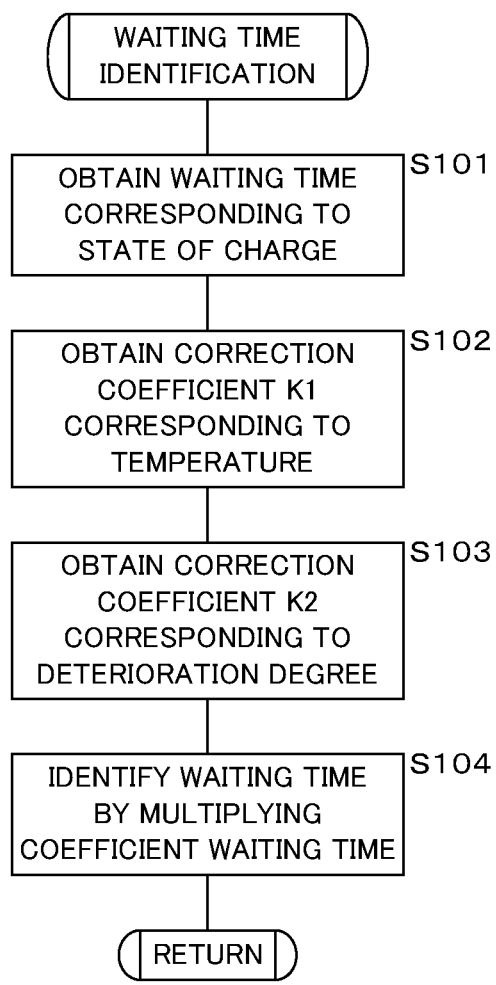
FIG. 13 A flowchart showing an example of the procedure of waiting time identification processing of the battery monitoring device of the present embodiment.

FIG. 13 is a flowchart showing an example of the procedure of the waiting time identification processing of the battery monitoring device 100 of the present embodiment. The control portion 10 obtains the waiting time corresponding to the state of charge of the secondary battery (S101), obtains the correction coefficient K1 corresponding to the temperature (cell temperature) of the secondary battery (S102), and obtains the correction coefficient K2 corresponding to the deterioration degree of the secondary battery (S103).

The control portion 10 identifies the final waiting time T by multiplying by the coefficients the waiting time corresponding to the state of charge of the secondary battery (for example, the waiting time initial value T0) obtained at step S101 (S104), and ends the processing. The waiting time T can be calculated by T=K1×K2×T0. Instead of the structure in which the waiting time initial value T0 is multiplied by all the correction coefficients K1 and K2, a structure may be adopted in which the waiting time initial value T0 is multiplied by only either of the correction coefficients K1 and K2.

Figure 14:
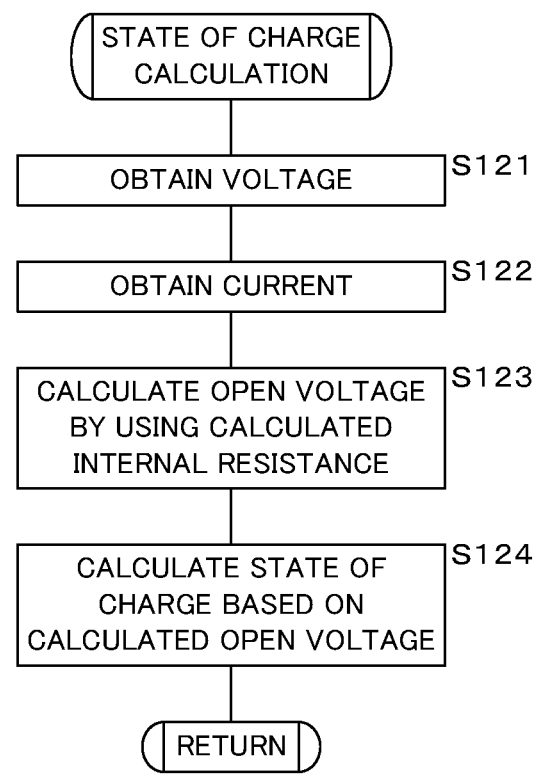
FIG. 14 A flowchart showing an example of the procedure of state of charge calculation processing of the battery monitoring device of the present embodiment.

FIG. 14 is a flowchart showing an example of the procedure of the state of charge calculation processing of the battery monitoring device 100 of the present embodiment. The control portion 10 obtains the voltage V of the secondary battery (S121), and obtains the current I of the secondary battery (S122).

The control portion 10 calculates the open voltage by using the calculated internal resistance R (S123). When the open voltage is OCV, it can be calculated by OCV=V−Vo. Here, Vo is an overvoltage, and is a voltage obtained by adding a polarizing voltage to a voltage expressed by the internal resistance R×the current I. The control portion 10 calculates the state of charge based on the calculated open voltage (S124), and ends the processing.

Figure 15:
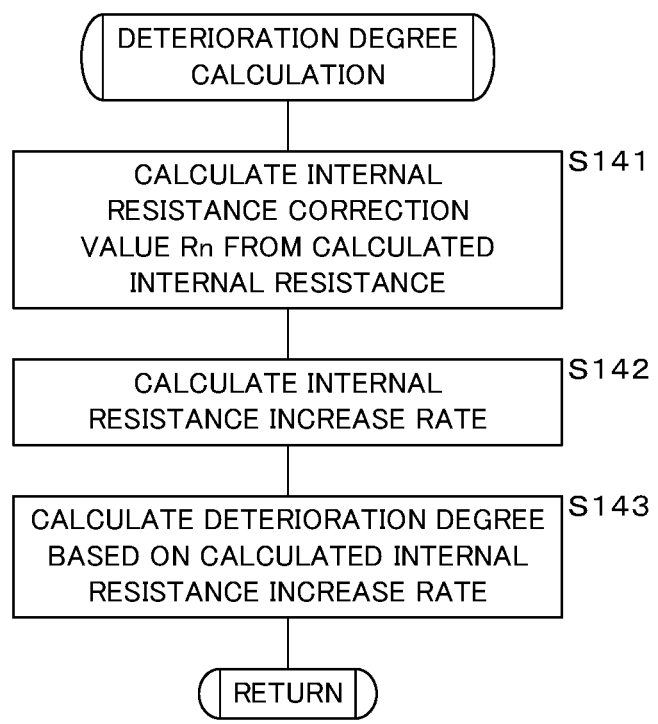
FIG. 15 A flowchart showing an example of the procedure of deterioration degree calculation processing of the battery monitoring device of the present embodiment.

FIG. 15 is a flowchart showing an example of the procedure of the deterioration degree calculation processing of the battery monitoring device 100 of the present embodiment. The control portion 10 calculates an internal resistance correction value Rn from the calculated internal resistance R (S141). The internal resistance correction value Rn is a value obtained by converting the calculated internal resistance R, for example, into a value when the state of charge is 50% and the temperature of the secondary battery is 25 degrees C.

The control portion 10 calculates the increase rate of the internal resistance (S142). The increase rate of the internal resistance can be calculated by Rn/R0. The control portion 10 calculates the deterioration degree based on the calculated internal resistance increase rate (S143), and ends the processing.

Second Embodiment

Figure 16:
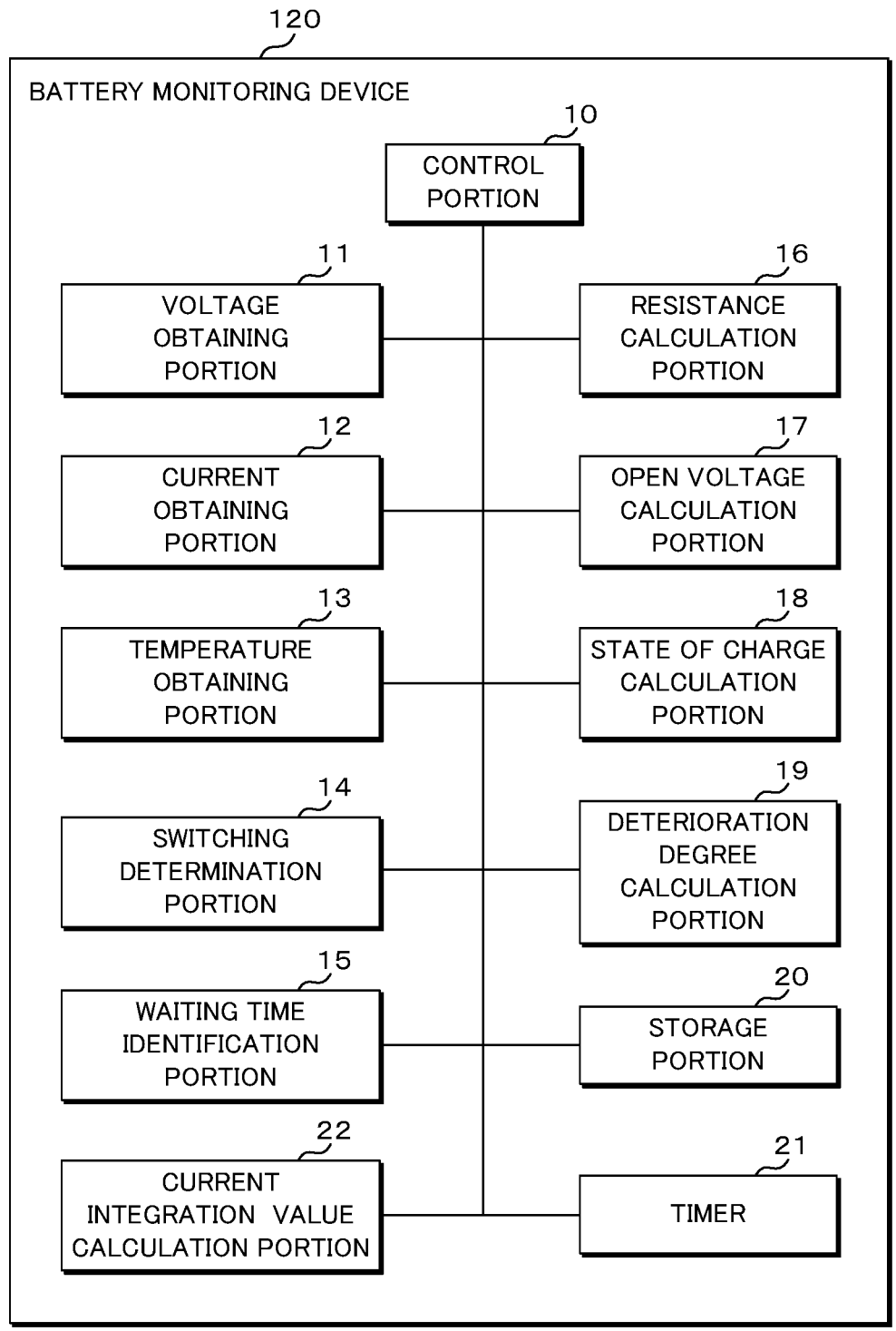
FIG. 16 A block diagram showing an example of the structure of a battery monitoring device of a second embodiment.

FIG. 16 is a block diagram showing an example of the structure of a battery monitoring device 120 of a second embodiment. A difference from the structure of the battery monitoring device 100 of the first embodiment shown in FIG. 2 is that a current integration value calculation portion 22 is provided. Hereinafter, the battery monitoring device 120 of the second embodiment will be described. Description of parts similar to those of the first embodiment is omitted.

In the first embodiment, the resistance calculation portion 16 calculates the internal resistance R of the secondary battery unit 50 when the current obtained by the current obtaining portion 12 after the waiting time T identified by the waiting time identification portion 15 is higher than the predetermined threshold value. In the second embodiment, a method of further accurately calculating the internal resistance R of the secondary battery unit 50 will be described.

Figure 17:
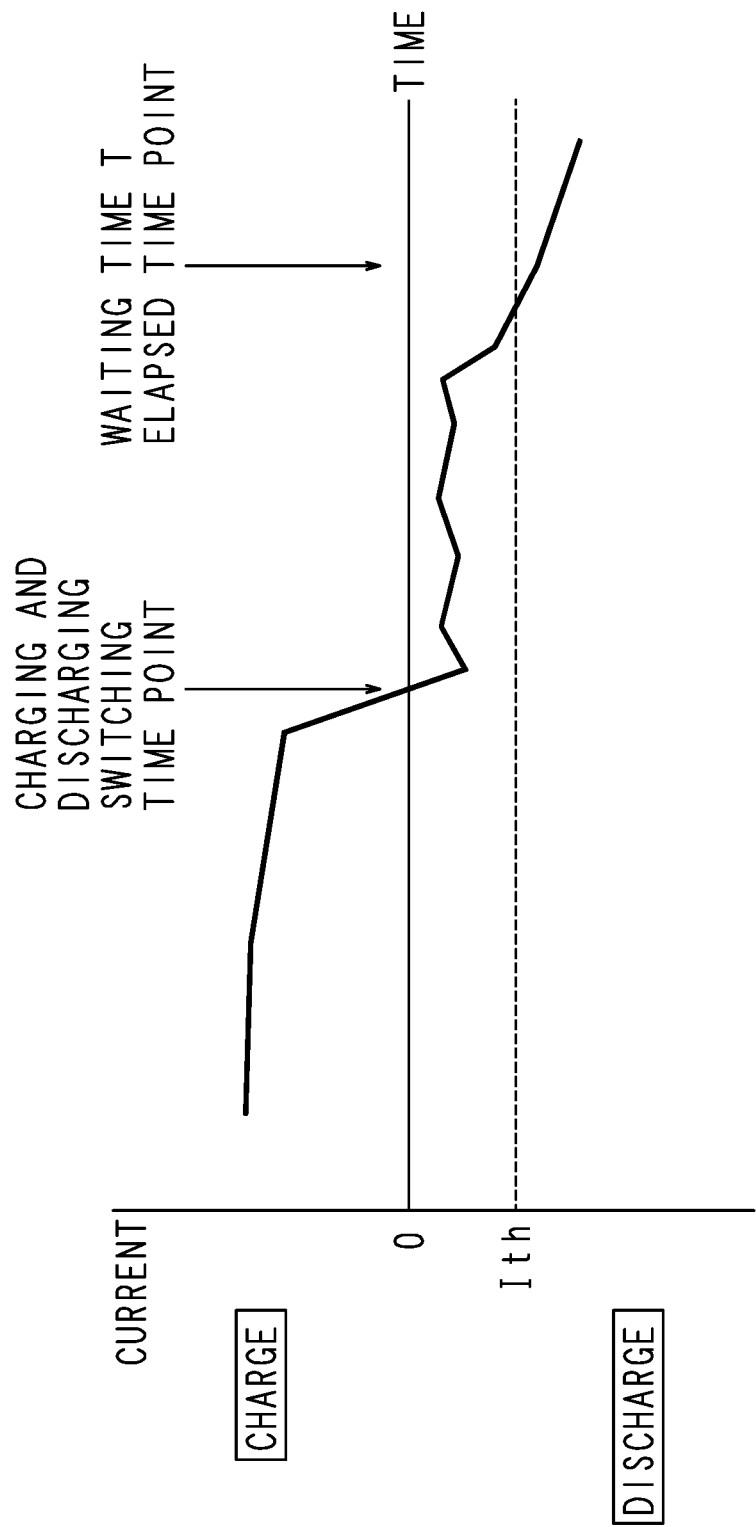
FIG. 17 A schematic view showing a first example of current transition before and after switching between charging and discharging of the secondary battery unit.

FIG. 17 is a schematic view showing a first example of current transition before and after switching between charging and discharging of the secondary battery unit 50. In FIG. 17, the vertical axis represents the current, the positive side represents charging, and the negative side represents discharging. The horizontal axis represents the time. As shown in FIG. 17, a condition is fulfilled that the current of the secondary battery unit 50 at the time point when the waiting time T has elapsed from the time point of switching between charging and discharging is not less than a predetermined threshold value Ith (this may be, for example, approximately 10 A but is not limited to 10 A). However, in a case where after switching between charging and discharging, the current value of the secondary battery unit 50 transitions among comparatively low values and exceeds the predetermined threshold value Ith immediately before the elapse of the waiting time T, there are cases where the current of the secondary battery unit 50 cannot be said to be in a sufficiently stable state. In the example of FIG. 17, the current after switching between charging and discharging transitions in a state of being lower than the threshold value Ith in most parts during the waiting time T. Moreover, although not shown, there are cases where a plurality of parts where the current value of the secondary battery unit 50 is lower than the threshold value Ith are included between the time point of switching between charging and discharging and the time point of elapse of the waiting time T.

Figure 18:
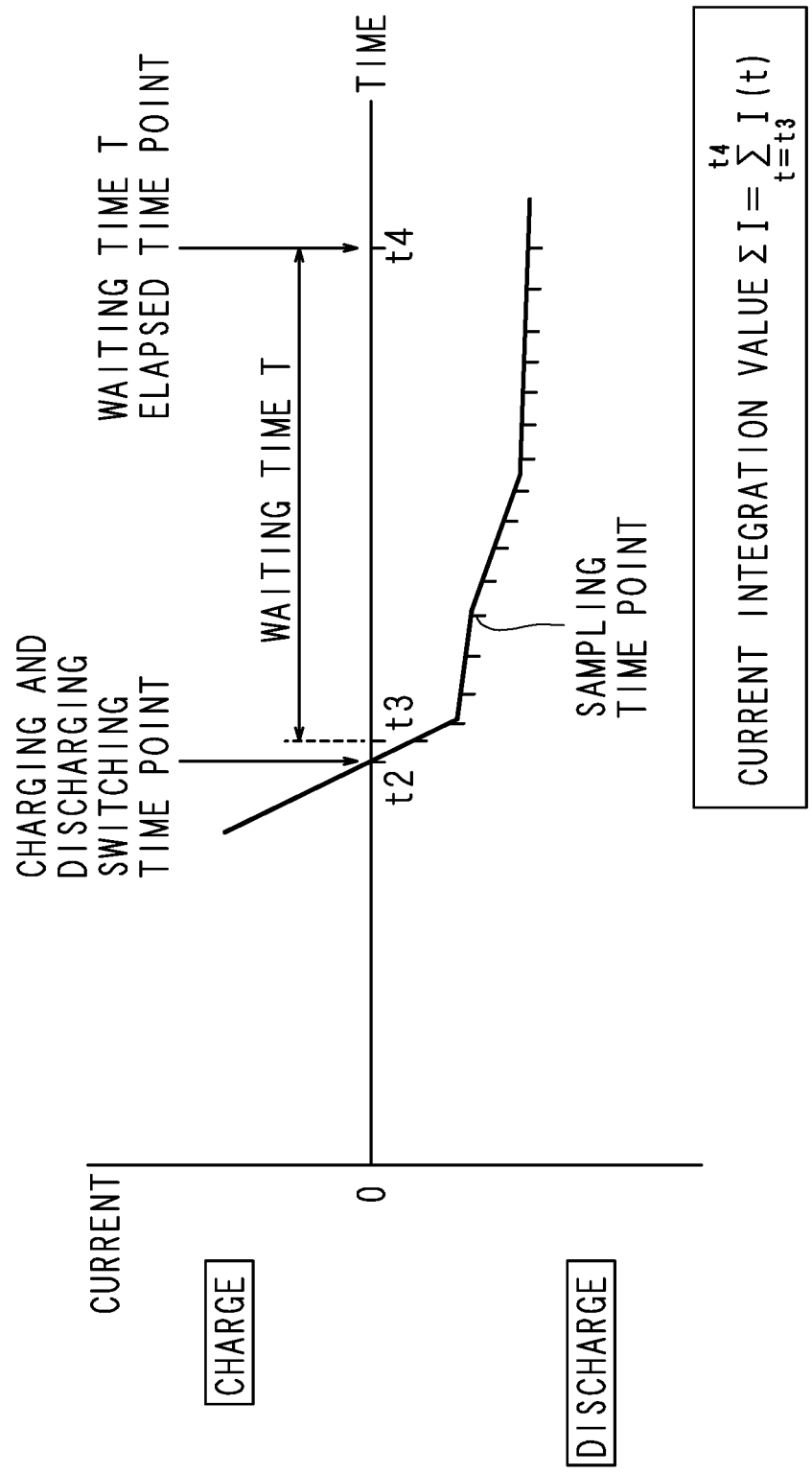
FIG. 18 An explanatory view showing a first example of the condition of the internal resistance calculation by the battery monitoring device of the second embodiment.

FIG. 18 is an explanatory view showing a first example of the condition of the internal resistance calculation by the battery monitoring device 120 of the second embodiment. The current integration value calculation portion 22 calculates the current integration value during the time from the time point when the switching determination portion 14 determines that switching between charging and discharging is present to the elapse of the waiting time T identified by the waiting time identification portion 15, based on the current obtained by the current obtaining portion 12. The "time point when the switching determination portion 14 determines" may be the time point of the next sampling after the occurrence of switching between charging and discharging.

For example, as shown in FIG. 18, when the time point when switching between charging and discharging occurs is t2, the time point of the first sampling after the time point t2 is t3 and the time point when the waiting time T (for example, 0.1 s) elapses from the time point t3 (which may be the time point t2) is t4, the current integration value ΣI can be calculated based on the total value of the current values sampled during the time from the time point t3 to the time point t4.

When the current integration value calculated by the current integration value calculation portion 22 is higher than a predetermined lower limit value (that is, when it is within a predetermined range), the resistance calculation portion 16 calculates the internal resistance R of the secondary battery unit 50.

The predetermined lower limit value can be calculated, for example, by the predetermined threshold value Ith (for example, 10 A)×the waiting time T (for example, 0.1 s)×a required coefficient α (α is, for example, 0.5≤α). Here, the predetermined threshold value Ith is a threshold value used when whether to calculate the internal resistance R of the secondary battery unit 50 or not is determined based on the current after the elapse of the waiting time T. When the coefficient α=1, the lower limit value is 1 (As). In this case, it is unnecessary to set an upper limit value.

Moreover, the predetermined lower limit value can be calculated, for example, by the current value I at the time point of elapse of the waiting time T (t4)×the waiting time T×a coefficient p (p is, for example, 0.5≤p≤1). Moreover, the upper limit value can be calculated, for example, by the current value I at the time point when the waiting time T elapses (t4)×the waiting time T×a coefficient q (q is, for example, 1≤q≤2). In this case, the resistance calculation portion 16 calculates the internal resistance R of the secondary battery unit 50 when the current integration value calculated by the current integration value calculation portion 22 is higher than the predetermined lower limit value and lower than the upper limit value (that is, when it is within a predetermined range). The lower limit value and the upper limit value are not limited to the above-described examples.

As described above, the provision of the condition that the current integration value from switching between charging and discharging to the elapse of the waiting time T is within a predetermined range (for example, higher than the lower limit value, or higher than the lower limit value and lower than the upper limit value) can eliminate a condition where the current value of the secondary battery unit 50 is not sufficiently stabilized such that it transitions among comparatively low values and increases immediately before the elapse of the waiting time T or a condition where the current value is not sufficiently stabilized such that a plurality of parts where the current value decreases during the time from the time point of switching between charging and discharging to the elapse of the waiting time T are present, so that the accuracy of calculation of the internal resistance R can be further improved.

Figure 19:
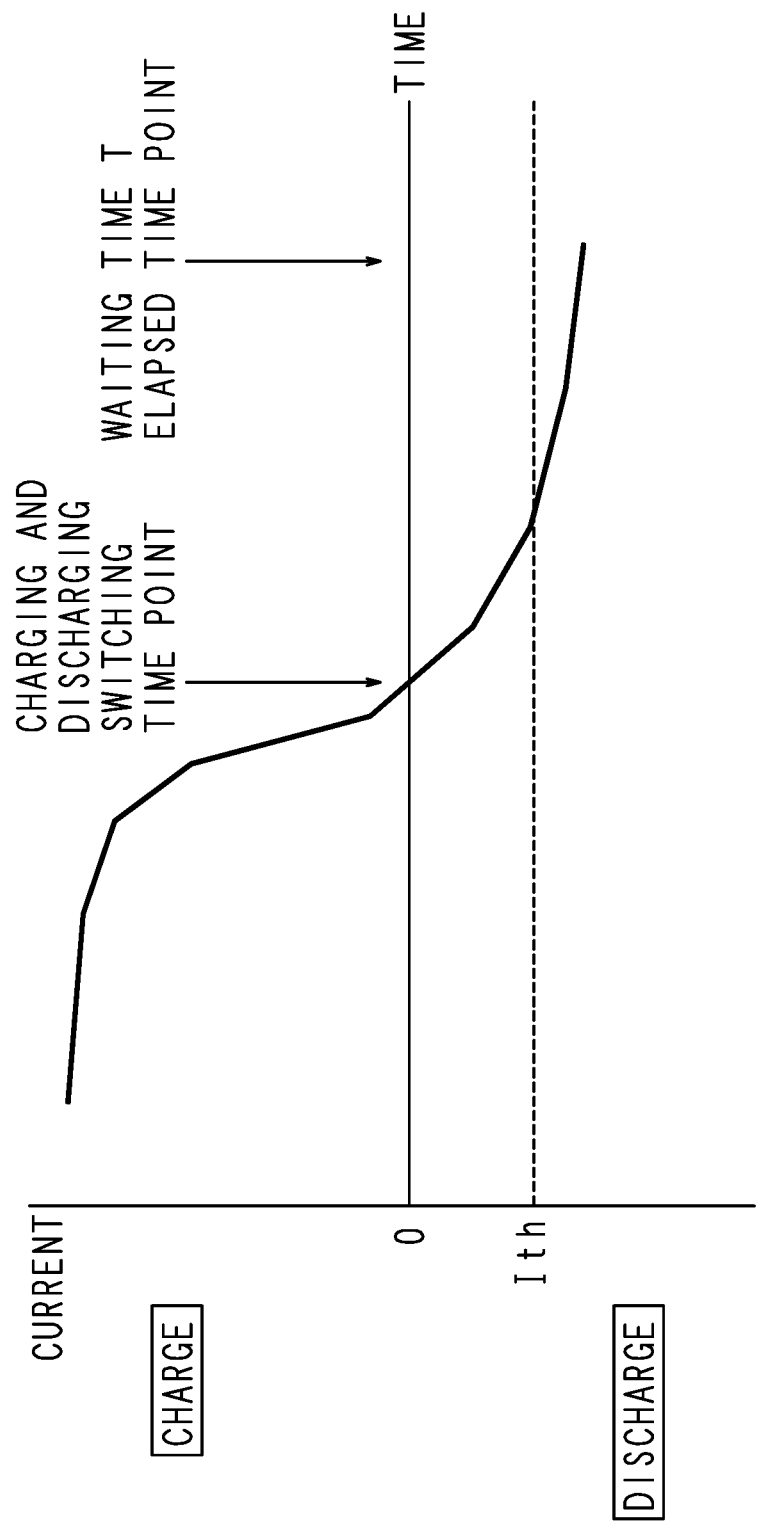
FIG. 19 A schematic view showing a second example of the current transition before and after switching between charging and discharging of the secondary battery unit.

FIG. 19 is a schematic view showing a second example of the current transition before and after switching between charging and discharging of the secondary battery unit 50. In FIG. 19, the vertical axis represents the current, the positive side represents charging, and the negative side represents discharging. The horizontal axis represents the time. As shown in FIG. 19, even in a case where after switching between charging and discharging, the current value of the secondary battery unit 50 transitions comparatively stably and the current after the elapse of the waiting time T is higher than the predetermined threshold value Ith, there are cases where the current value of the secondary battery unit 50 before switching between charging and discharging transitions among high values. Moreover, although not shown, there are also cases where the current value of the secondary battery unit 50 before switching between charging and discharging transitions among low values compared with the current value after switching between charging and discharging. As described above, even in a case where the current value of the secondary battery unit 50 transitions comparatively stably and the current after the elapse of the waiting time T is higher than the predetermined threshold value Ith, when the current value of the secondary battery unit 50 before switching between charging and discharging transitions among low values or when it transitions among high values, there are cases where the condition of the charge transfer of the secondary battery unit 50 is different between before and after switching between charging and discharging.

Figure 20:
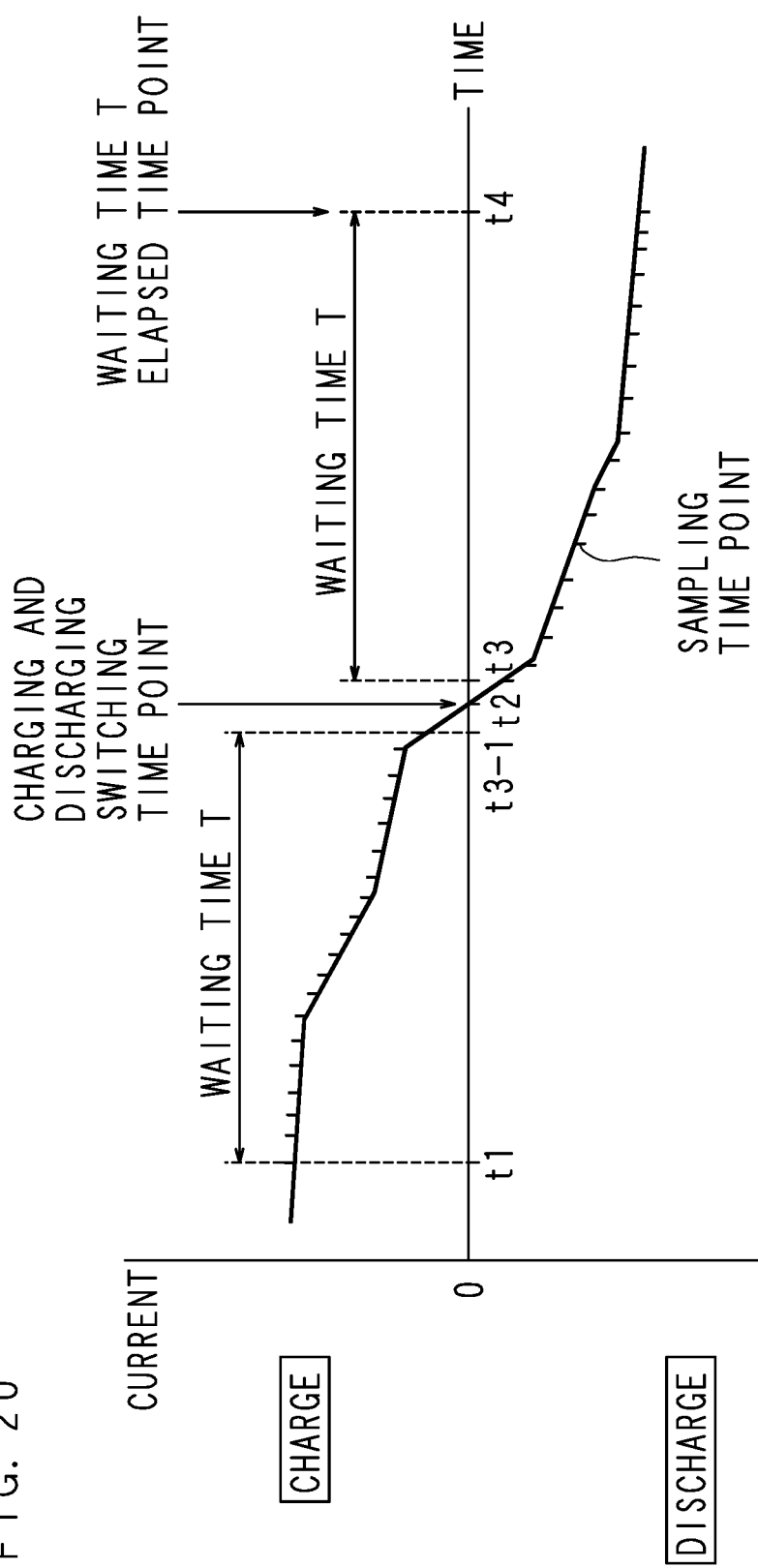
FIG. 20 An explanatory view showing a second example of the condition of the internal resistance calculation by the battery monitoring device of the second embodiment.

FIG. 20 is an explanatory view showing a second example of the condition of the internal resistance calculation by the battery monitoring device 120 of the second embodiment. Based on the current obtained by the current obtaining portion 12, the current integration value calculation portion 22 calculates an after-switching current integration value during the time from the time point when the switching determination portion 14 determines that switching between charging and discharging is present to the elapse of the waiting time T identified by the waiting time identification portion 15 and a before-switching current integration value during the time from a before-switching time point, the waiting time T prior to the time point when the determination is made, to the time point when the determination is made. The "time point when the switching determination portion 14 determines" may be the time point of the next sampling after the occurrence of switching between charging and discharging.

For example, as shown in FIG. 20, when the time point when switching between charging and discharging occurs is t2, the time point of the first sampling after the time point t2 is t3, the time point when the waiting time T elapses from the time point t3 (which may be the time point t2) is t4 and the before-switching time point the waiting time T prior to the time point t3 (which may be the time point t2) is t1, the after-switching current integration value ΣIa can be calculated based on the total value of the current values sampled during the time from the time point t3 to the time point t4. Moreover, the before-switching current integration value ΣIb can be calculated based on the total value of the current values sampled during the time from the time point t1 to a time point (t3-1). Here, the time point (t3-1) is the sampling time point immediately preceding the sampling time point t3.

When the difference between the after-switching current integration value ΣIa and the before-switching current integration value ΣIb is not more than a predetermined difference threshold value, the resistance calculation portion 16 calculates the internal resistance R of the secondary battery unit 50. The predetermined difference threshold value can be calculated, for example, by the predetermined threshold value Ith×the waiting time T×a required coefficient β (β is, for example, 0.1≤β≤2). Here, the predetermined threshold value Ith is a threshold value used when whether to calculate the internal resistance R of the secondary battery unit 50 or not is determined based on the current after the elapse of the waiting time T.

As described above, the provision of the condition that the difference between the current integration values before and after charging and discharging is not more than the predetermined difference threshold value can eliminate a condition where the charge movement tendency is different such that the difference in the current value of the secondary battery unit 50 between before and after charging and discharging increases, so that the accuracy of calculation of the internal resistance R can be further improved.

While a case where switching is made from charging to discharging is described in the above-described FIG. 17 to FIG. 20, the same applied to a case where switching is made from discharging to charging. Moreover, as the condition to determine whether to calculate the internal resistance R of the secondary battery unit 50 or not, it may be decided to calculate the internal resistance R when the condition that the current integration value ΣI is within the predetermined range and the condition that the difference between the before-switching current integration value ΣIb and the after-switching current integration value ΣIa is not more than the difference threshold value described in the second embodiment are fulfilled in addition to the condition that the current after the waiting time T is higher than the predetermined threshold value described in the first embodiment, or it may be decided to calculate the internal resistance R when only any of the conditions is fulfilled.

Figure 21:
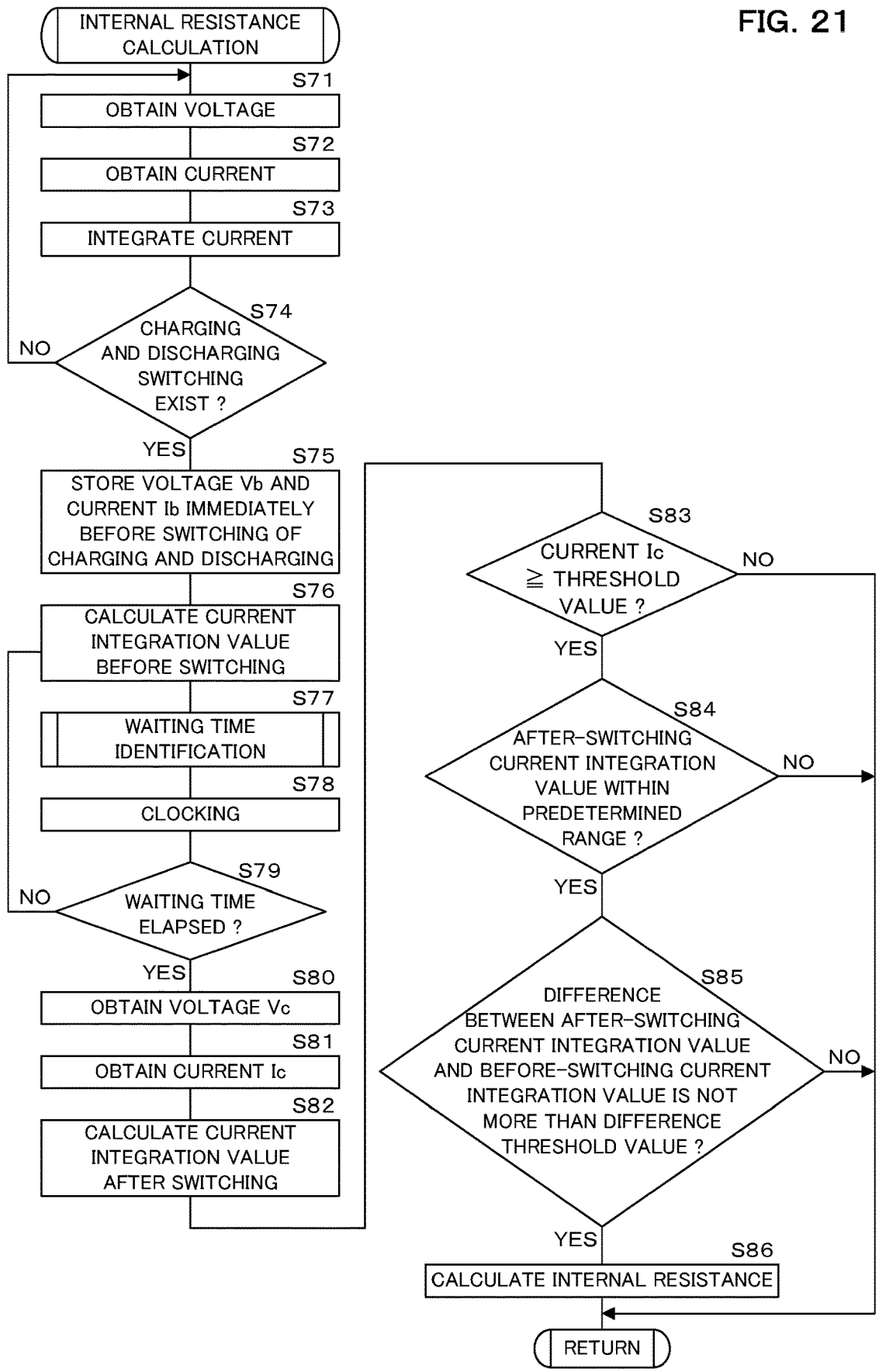
FIG. 21 A flowchart showing an example of the procedure of the internal resistance calculation processing of the battery monitoring device of the second embodiment.

FIG. 21 is a flowchart showing an example of the procedure of the internal resistance calculation processing of the battery monitoring device 120 of the second embodiment. The control portion 10 obtains the voltage of the secondary battery unit 50 (S71), obtains the current of the secondary battery unit 50, and adds up the current value (S73). The control portion 10 determines the presence or absence of switching between charging and discharging based on the obtained current (S74). The determination as to the presence or absence of switching between charging and discharging is similar to that in the case of FIG. 12. When switching between charging and discharging is absent (NO at S74), the control portion 10 continues the processing of step S71 and succeeding steps.

When switching between charging and discharging is present (YES at S74), the control portion 10 stores the voltage Vb and the current Ib obtained immediately before the switching between charging and discharging into the storage portion 20 (S75), and calculates the before-switching current integration value ΣIb (S76).

The control portion 10 performs the waiting time identification processing (S77). Details of the waiting time identification processing are similar to those in the case of FIG. 13.

The control portion 10 performs clocking (S78). The start time point of the clocking may be the time point when it is determined that switching between charging and discharging is present (the time point when the above-mentioned latest voltage and current are obtained) or may be the time point when the most recent (last) voltage and current are obtained. The control portion 10 determines whether the waiting time has elapsed or not (S79), and when the waiting time has not elapsed (NO at S79), the processing of step S78 and succeeding steps is continued.

When the waiting time has elapsed (YES at S79), the control portion 10 obtains the voltage Vc of the secondary battery 50 (S80), obtains the current Ic of the secondary battery 50 (S81), and calculates the after-switching current integration value ΣIa (S82). The control portion 10 determines whether the obtained current IC is not less than a predetermined threshold value or not (S83). The threshold value may be a value of an extent necessary for accurately calculating the internal resistance.

When the obtained current Ic is not less than the predetermined threshold value (YES at S83), the control portion 10 determines whether the after-switching current integration value ΣIa (corresponding to the current integration value ΣI) is within the predetermined range or not (S84). When the after-switching current integration value ΣIa is within the predetermined range (YES at S84), the control portion 10 determines whether the difference between the after-switching current integration value ΣIa and the before-switching current integration value ΣIb is not more than the difference threshold value or not (S85).

When the difference between the after-switching current integration value ΣIa and the before-switching current integration value ΣIb is not more than the difference threshold value (YES at S85), the control portion 10 calculates the internal resistance (S86), and ends the processing. The internal resistance R can be calculated, for example, by R=(Vc−Vb)/(Ic−Ib). When the obtained current Ic is not not less than the predetermined threshold value (NO at S83), when the after-switching current integration value ΣIa is not within the predetermined range (NO at S84) or when the difference between the after-switching current integration value ΣIa and the before-switching current integration value ΣIb is not not more than the difference threshold value (NO at S85), the control portion 10 ends the processing without performing the processing of S86.

While the example of FIG. 21 is processing in which the internal resistance R is calculated when three conditions of steps S83, S84 and S85 are all fulfilled, the present invention is not limited thereto. For example, the internal resistance R may be calculated when two conditions of steps S83 and S84 are fulfilled or when two conditions of steps S83 and S85 are fulfilled.

Third Embodiment

In a third embodiment, a method of more accurately calculating the internal resistance R of the secondary battery unit 50 will be described. The structure of the battery monitoring device may be any of the structures shown in FIG. 2 and FIG. 16. When the time point when the switching determination portion 14 determines that switching between charging and discharging is present is within a predetermined time from the time point of the most recent determination, the resistance calculation portion 16 does not calculate the internal resistance of the secondary battery unit 50. The switching determination portion 14 can transmit a trigger (signal) at the time point when it determines that switching between charging and discharging is present. While the predetermined time may be, for example, 50 ms, it is not limited thereto.

Figure 22:
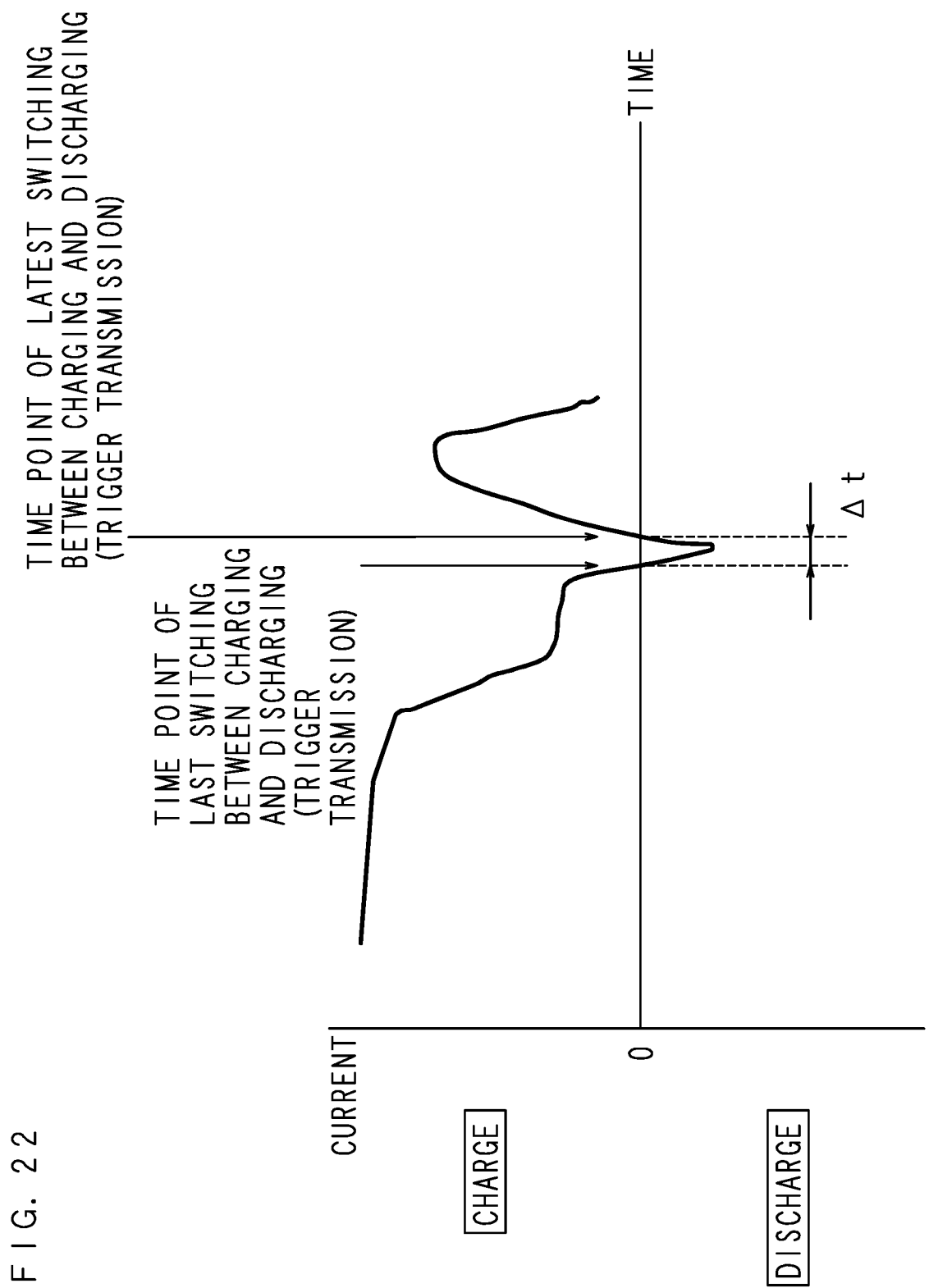
FIG. 22 A schematic view showing a third example of the current transition before and after switching between charging and discharging of the secondary battery unit.

FIG. 22 is a schematic view showing a third example of the current transition before and after switching between charging and discharging of the secondary battery unit 50. In FIG. 22, the vertical axis represents the current, the positive side represents charging, and the negative side represents discharging. The horizontal axis represents the time. As shown in FIG. 22, in a case where switching between charging and discharging currents occurs such that switching from charging to discharging is made when the charging current is flowing (the time point of the last switching between charging and discharging, that is, the time point when it is most recently determined that switching between charging and discharging is present, trigger transmission), discharging current flows, switching to charging is made within a predetermined time (the time Δt shown in FIG. 22 is within the predetermined time) (the time point of the latest switching between charging and discharging, trigger transmission) and charging current flows, since the accuracy of calculation of the internal resistance of the secondary battery unit 50 is degraded, the internal resistance of the secondary battery unit 50 is not calculated. When none of the current value and the voltage value of the secondary battery unit 50 changes, since it can be considered to be mere noise, it is not made the target of trigger counting.

In the above-described first embodiment, even if switching between charging and discharging of the secondary battery unit 50 is suddenly made as shown in FIG. 22, the internal resistance of the secondary battery unit 50 is calculated if the condition that the current value after the elapse of the waiting time is not less than the threshold value is fulfilled. However, in a case where switching between charging and discharging of the secondary battery unit 50 is suddenly made, there is a possibility that the accuracy of calculation of the internal resistance of the secondary battery unit 50 is deteriorated. According to the third embodiment, a low-accuracy internal resistance value can be prevented from being calculated.

Figure 23:
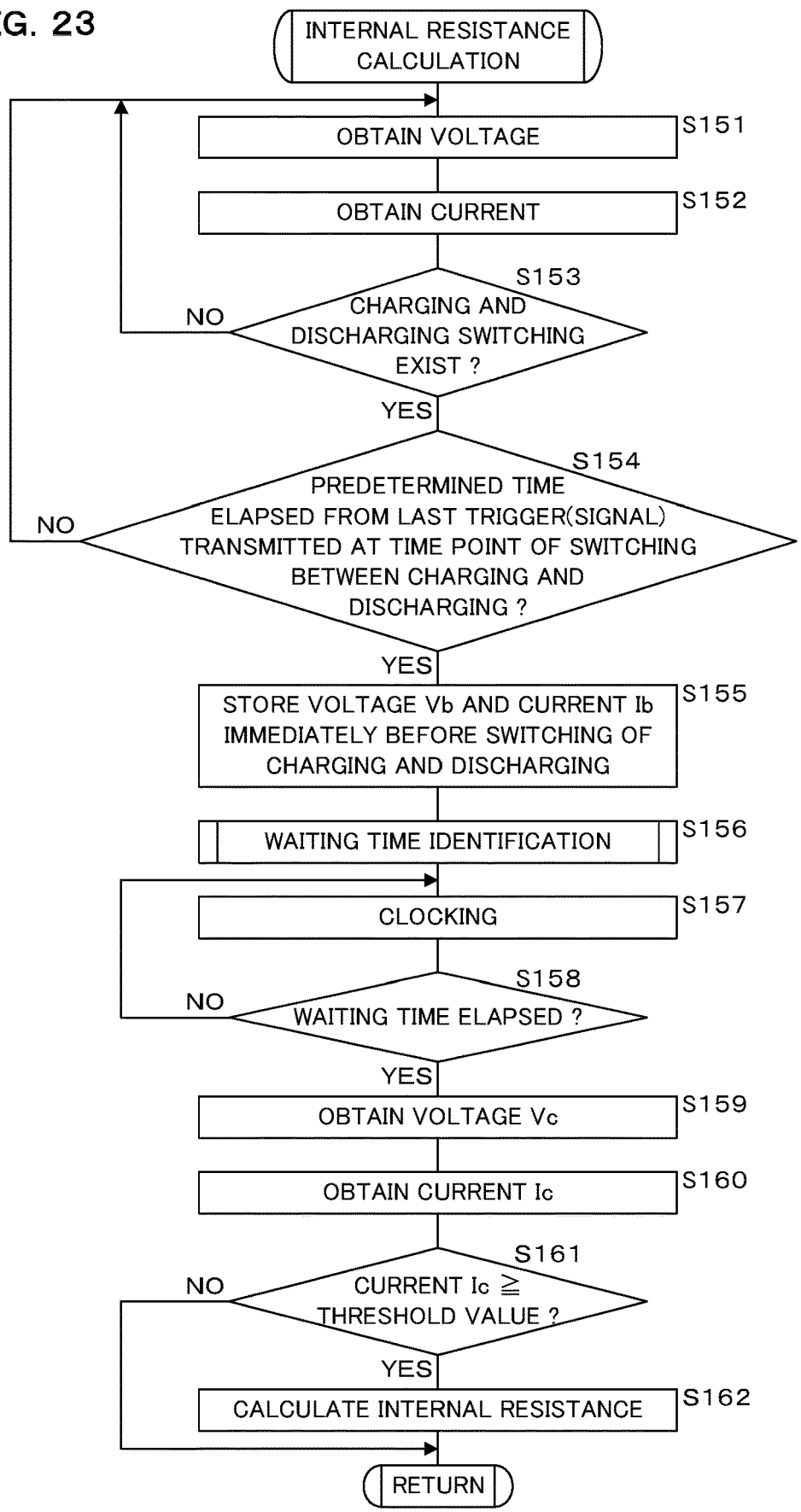
FIG. 23 A flowchart showing an example of the procedure of the internal resistance calculation processing of the battery monitoring device of a third embodiment FIG. 24 A schematic view showing a fourth example of the current transition after switching between charging and discharging of the secondary battery unit.

FIG. 23 is a flowchart showing an example of the procedure of the internal resistance calculation processing of the battery monitoring device of the third embodiment. The control portion 10 obtains the voltage of the secondary battery (S151), and obtains the current of the secondary battery (S152). The control portion 10 determines the presence or absence of switching between charging and discharging based on the obtained current (S153).

When switching between charging and discharging is absent (NO at S153), the control portion 10 continues the processing of step S151 and succeeding steps. When switching between charging and discharging is present (YES at S153), the control portion 10 determines whether or not a predetermined time has elapsed from the last (most recently) trigger (signal) transmitted at the time point of switching between charging and discharging (S154). When the predetermined time has not elapsed (NO at S154), the control portion 10 stops the calculation of the internal resistance of the secondary battery, and continues the processing of step S15 and succeeding steps.

When the predetermined time has elapsed (YES at S154), the control portion 10 stores the voltage Vb and the current Ib obtained immediately before the switching between charging and discharging into the storage portion 20 (S155).

The control portion 10 performs the waiting time identification processing (S156). The control portion 10 performs clocking (S157). The start time point of the clocking may be the time point when it is determined that switching between charging and discharging is present (the time point when the above-mentioned latest voltage and current are obtained) or may be the time point when the most recent (last) voltage and current are obtained. The control portion 10 determines whether the waiting time has elapsed or not (S158), and when the waiting time has not elapsed (NO at S158), the processing of step S157 and succeeding steps is continued.

When the waiting time has elapsed (YES at S158), the control portion 10 obtains the voltage Vc of the secondary battery (S159), and obtains the current Ic of the secondary battery (S160). The control portion 10 determines whether the obtained current Ic is not less than a predetermined threshold value or not (S161). The threshold value may be a value of an extent necessary for accurately calculating the internal resistance.

When the obtained current Ic is not less than the predetermined threshold value (YES at S161), the control portion 10 calculates the internal resistance (S162), and ends the processing. When the obtained current Ic is not not less than the predetermined threshold value (NO at S161), the control portion 10 ends the processing without performing the processing of step S162.

Fourth Embodiment

In a fourth embodiment, a method of more accurately calculating the internal resistance R of the secondary battery unit 50 will be described. The structure of the battery monitoring device may be any of the structures shown in FIG. 2 and FIG. 16. The resistance calculation portion 16 has a function as a current change degree calculation portion, and calculates the current change degree based on the current obtained by the current obtaining portion 12. For example, in a case where the current is obtained at predetermined sampling intervals, when the difference between the current obtained at the latest sampling time point and the current obtained at the most recent (last) sampling time point is $\Delta I$ and the sampling interval is $\Delta ts$, the current change degree (for example, a value obtained by differentiating the current with respect to the time) can be calculated, for example, by an expression $\Delta I/\Delta ts$.

The resistance calculation portion 16 does not calculate the internal resistance of the secondary battery unit 50 when the calculated change degree is higher than a predetermined change degree threshold value during the time from the time point when the switching determination portion 14 determines that switching between charging and discharging is present to the elapse of the waiting time T identified by the waiting time identification portion 15.

Figure 24:
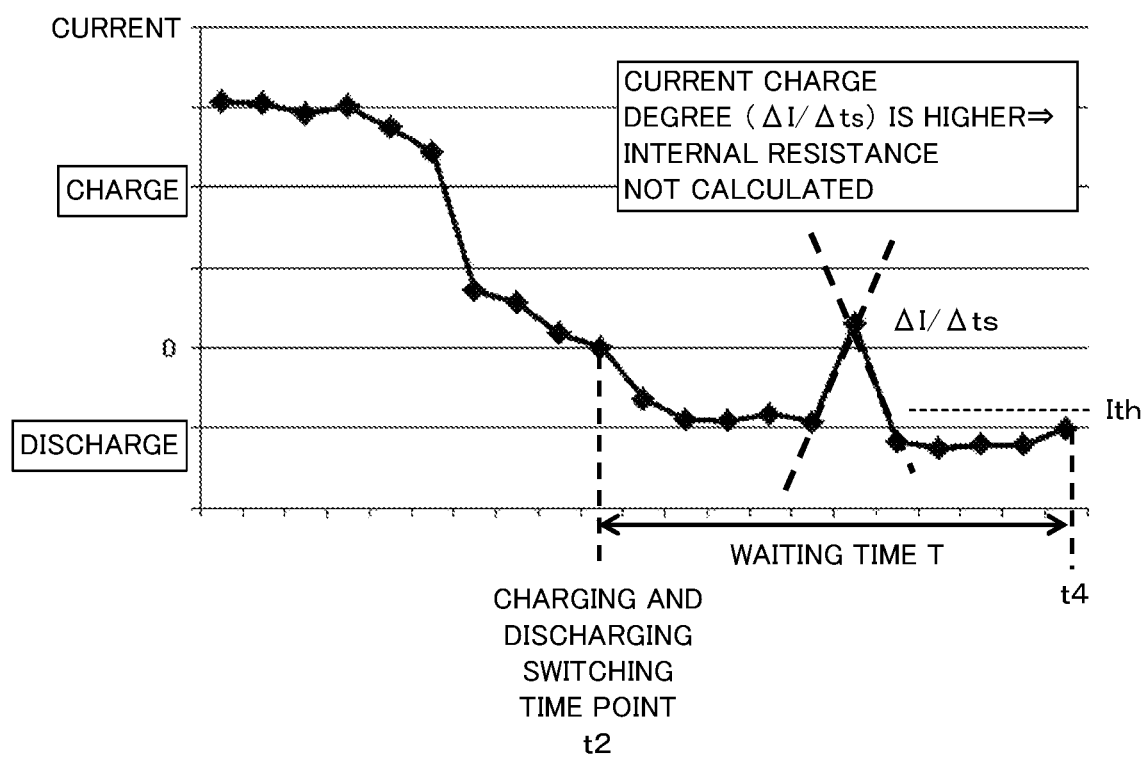

FIG. 24 is a schematic view showing a fourth example of the current transition after switching between charging and discharging of the secondary battery unit 50. In FIG. 24, the vertical axis represents the current, the positive side represents charging, and the negative side represents discharging. The horizontal axis represents the time. As shown in FIG. 24, the time point when switching between charging and discharging occurs is t2, and the time point when the waiting time T elapses is t4. Even in a case where the current after the time point t4 where the waiting time T elapses is higher than the predetermined threshold value Ith, when the current change degree ΔI/Δts based on the current obtained by performing sampling during the time after the time point t2 to the time point t4 is higher than the predetermined change degree threshold value, the internal resistance of the secondary battery unit 50 is not calculated.

Even in a case where the current after the elapse of the waiting time T is higher than the predetermined threshold value Ith, when the current change degree increases during the time after switching between charging and discharging to the elapse of the waiting time T, there is a possibility that the internal resistance of the secondary battery unit 50 cannot be calculated accurately. Accordingly, when the current change degree is higher than the predetermined change degree threshold value during the time from when it is determined that switching between charging and discharging is present to the elapse of the waiting time T, by not calculating the internal resistance of the secondary battery unit 50, the calculation accuracy of the secondary battery unit 50 can be prevented from decreasing.

Figure 25:
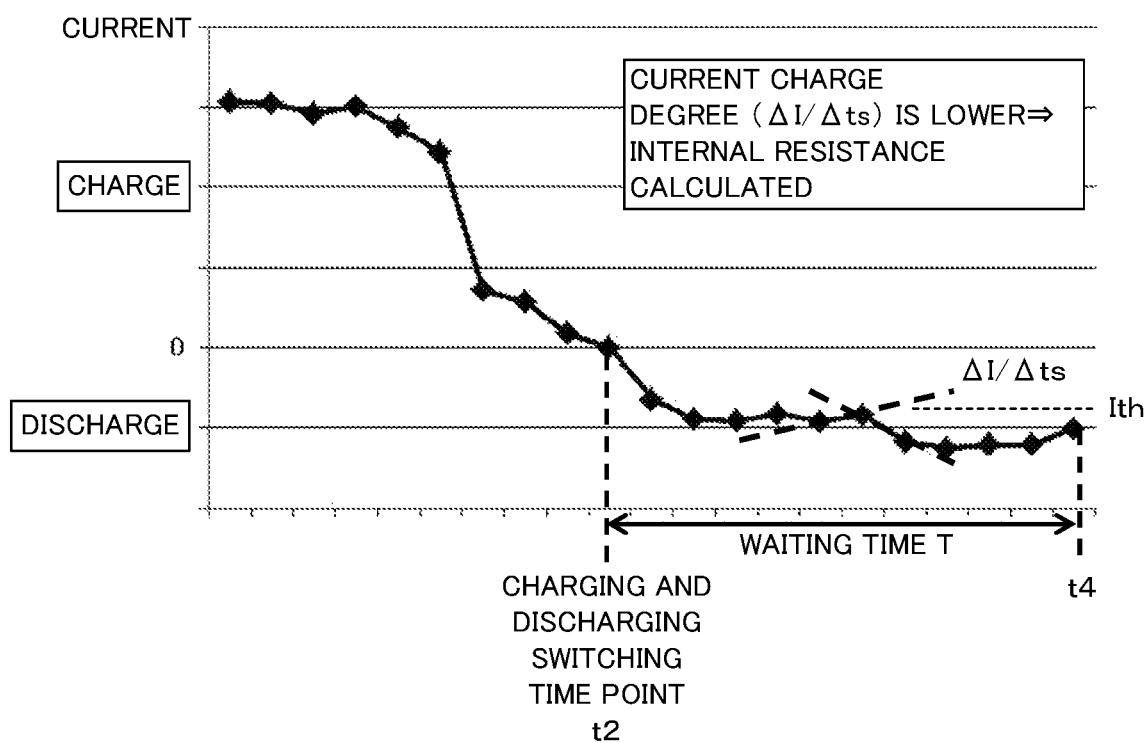
FIG. 25 A schematic view showing a fifth example of the current transition after switching between charging and discharging of the secondary battery unit.

FIG. 25 is a schematic view showing a fifth example of the current transition after switching between charging and discharging of the secondary battery unit 50. In FIG. 25, the vertical axis represents the current, the positive side represents charging, and the negative side represents discharging. The horizontal axis represents the time. As shown in FIG. 25, the time point when switching between charging and discharging occurs is t2, and the time point when the waiting time T elapses is t4. In the example of FIG. 25, the current change degree ΔI/Δts based on the current obtained by performing sampling during the time after the time point t2 to the time point t4 is lower than the predetermined change degree threshold value. Moreover, the current after the time point t4 when the waiting time T elapses is higher than the predetermined threshold value Ith. In the case as shown in FIG. 25, since the internal resistance of the secondary battery unit 50 can be calculated accurately, the internal resistance of the secondary battery unit 50 is calculated.

The above-mentioned change degree threshold value may be set, for example, as follows: The equivalent circuit of the secondary battery unit 50 is simplified and expressed, for example, by a series circuit of a resistance R and a capacitor C. When the voltage V is applied to the series circuit of the resistance R and the capacitor C, the voltage Vc(t) of the capacitor C can be expressed by $Vc(t)=V(1-e^{-t/a})$. Here, a is a time constant (a=R×C). When the sampling interval is Ts (for example, 10 ms), the voltage of the capacitor C when t=Ts is k×V and the maximum value of the current flowing through the secondary battery unit 50 is Ix, the current value when t=Ts can be expressed by k×Ix. In this case, the change degree threshold value can be obtained by k×Ix/Ts. The change degree threshold value can be changed as appropriate according to the temperature, deterioration degree and the like of the secondary battery unit 50. The change degree threshold value obtaining method is an example, and is not limited to the above-described example.

Figure 26:
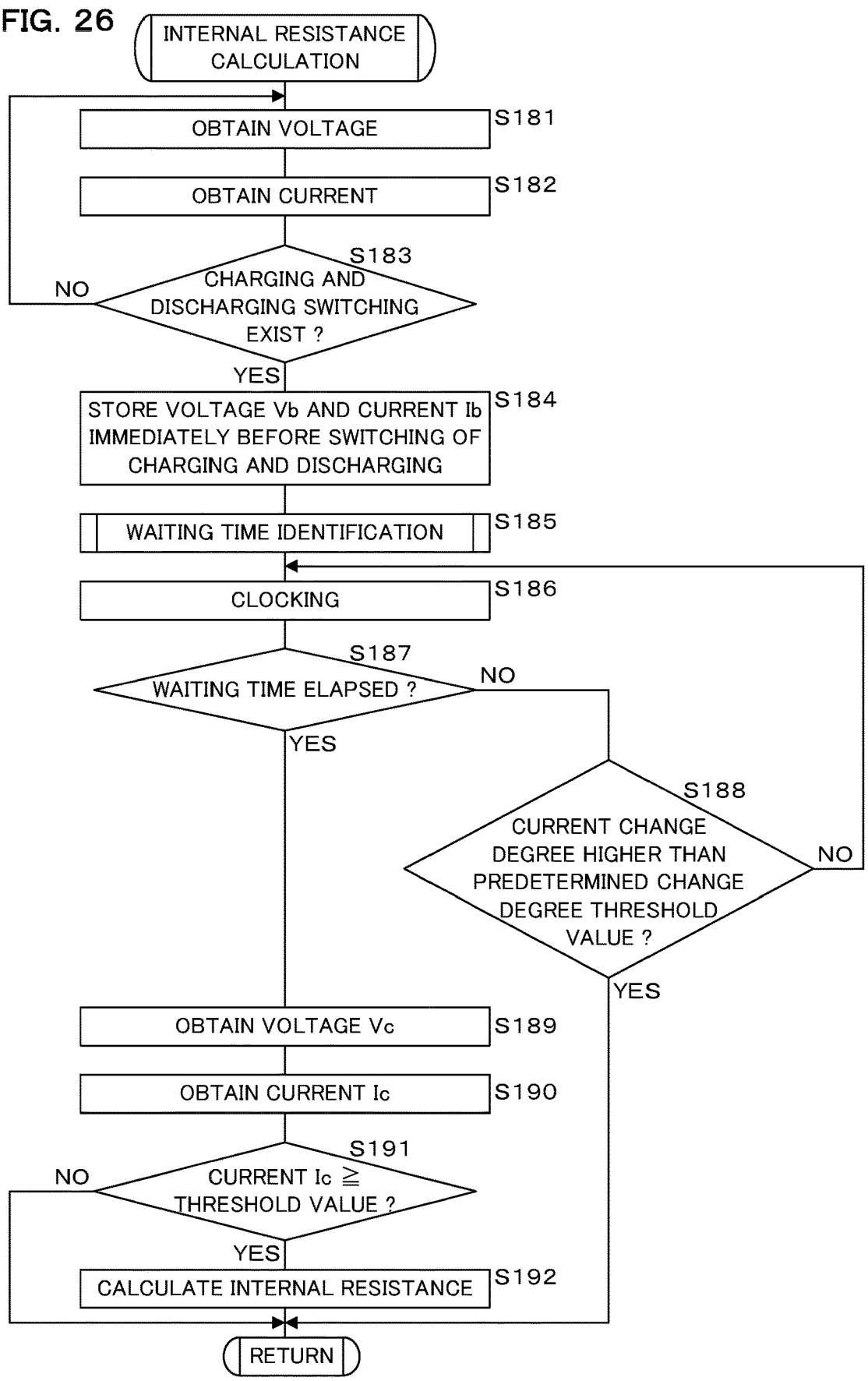
FIG. 26 A flowchart showing an example of the procedure of the internal resistance calculation processing of the battery monitoring device of a fourth embodiment.

FIG. 26 is a flowchart showing an example of the procedure of the internal resistance calculation processing of the battery monitoring device 100 of the fourth embodiment. The control portion 10 obtains the voltage of the secondary battery (S181), and obtains the current of the secondary battery (S182). The control portion 10 determines the presence or absence of switching between charging and discharging based on the obtained current (S183).

When switching between charging and discharging is absent (NO at S183), the control portion 10 continues the processing of step S181 and succeeding steps. When switching between charging and discharging is present (YES at S183), the control portion 10 stores the voltage Vb and the current Ib obtained immediately before switching between charging and discharging into the storage portion 20 (S184).

The control portion 10 performs the waiting time identification processing (S185). The control portion 10 performs clocking (S186). The control portion 10 determines whether the waiting time has elapsed or not (S187), and when the waiting time has not elapsed (NO at S187), the control portion 10 determines whether the current change degree is higher than the predetermined change degree threshold value or not (S188). When the current change degree is not higher than the predetermined change degree threshold value (NO at S188), the control portion 10 continues the processing of step S186 and succeeding steps.

When the waiting time has elapsed (YES at S187), the control portion 10 obtains the voltage Vc of the secondary battery (S189), and obtains the current Ic of the secondary battery (S190). The control portion 10 determines whether the obtained current Ic is not less than the predetermined threshold value or not (S191).

When the obtained current Ic is not less than the predetermined threshold value (YES at S191), the control portion 10 calculates the internal resistance (S192), and ends the processing. When the obtained current Ic is not not less than the predetermined threshold value (NO at S191) or when the current change degree is higher than the predetermined change degree threshold value (YES at S188), the control portion 10 ends the processing without performing the processing of step S192.

The internal resistance calculation device (the battery monitoring device 100) of the present embodiment may be implemented by using a general-purpose computer provided with a CPU (processor), a RAM (memory) and the like. That is, the internal resistance calculation device (the battery monitoring device 100) can be implemented on a computer by loading a computer program determining the procedure of each processing as shown in FIG. 11 to FIG. 15, FIG. 21, FIG. 23 and FIG. 26 into the RAM (memory) provided in the computer and executing the computer programs by the CPU (processor). The computer programs defining each processing procedure illustrated in FIG. 11 to FIG. 15, FIG. 21, FIG. 23 and FIG. 26 to be executed by the CPU can be recorded onto a non-transitory computer readable recording medium.

While description is given with the secondary battery being a lithium-ion battery in the above-described embodiments, the secondary battery is not limited to a lithium-ion battery, and provision may also be made, for example, to a nickel-hydrogen battery and a nickel-cadmium battery.

It should be considered that the disclosed embodiments are not limitative but illustrative in all aspects. The scope of the present invention is defined not by the description given above but by the appended claims, and all changes that fall within the definition and scope equivalent to the claims are to be embraced.

It is to be noted that, as used herein and in the appended claims, the singular forms "a", "an", and "the" include plural referents unless the context clearly dictates otherwise.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. An internal resistance calculation device that calculates an internal resistance of a secondary battery, comprising:
   a voltage obtaining portion that obtains a voltage of the secondary battery;
   a current obtaining portion that obtains a current of the secondary battery;
   a switching determination portion that determines the presence or absence of switching between charging and discharging of the secondary battery based on the current obtained by the current obtaining portion;
   an identification portion that identifies a waiting time based on a boundary frequency range in which a diffusion impedance arising from a process of diffusion of a predetermined ion contributes to an impedance of the secondary battery in an impedance spectrum of the secondary battery; and
   a resistance calculation portion that calculates the internal resistance of the secondary battery based on the voltage obtained by the voltage obtaining portion and the current obtained by the current obtaining portion after the waiting time identified by the identification portion when the switching determination portion determines that switching between charging and discharging is present.

2. The internal resistance calculation device according to claim 1,
   wherein the resistance calculation portion
   calculates the internal resistance of the secondary battery based on the voltage obtained by the voltage obtaining portion and the current obtained by the current obtaining portion before the switching determination portion determines that switching between charging and discharging is present and the voltage obtained by the voltage obtaining portion and the current obtained by the current obtaining portion after the waiting time identified by the identification portion.

3. The internal resistance calculation device according to claim 2,
   wherein the resistance calculation portion
   calculates the internal resistance of the secondary battery when the current obtained by the current obtaining portion after the waiting time identified by the identification portion is higher than a predetermined threshold value.

4. The internal resistance calculation device according to claim 3, comprising a current integration value calculation portion that calculates a current integration value during a time from a time point when the switching determination portion determines that switching between charging and discharging is present to the elapse of the waiting time identified by the identification portion, based on the current obtained by the current obtaining portion,
   wherein the resistance calculation portion
   calculates the internal resistance of the secondary battery when the current integration value calculated by the current integration value calculation portion is higher than a predetermined lower limit value.

5. The internal resistance calculation device according to claim 2, comprising a current integration value calculation portion that calculates a current integration value during a time from a time point when the switching determination portion determines that switching between charging and discharging is present to the elapse of the waiting time identified by the identification portion, based on the current obtained by the current obtaining portion,
   wherein the resistance calculation portion
   calculates the internal resistance of the secondary battery when the current integration value calculated by the current integration value calculation portion is higher than a predetermined lower limit value.

6. The internal resistance calculation device according to claim 1,
   wherein the resistance calculation portion
   calculates the internal resistance of the secondary battery when the current obtained by the current obtaining portion after the waiting time identified by the identification portion is higher than a predetermined threshold value.

7. The internal resistance calculation device according to claim 6, comprising a current integration value calculation portion that calculates a current integration value during a time from a time point when the switching determination portion determines that switching between charging and discharging is present to the elapse of the waiting time identified by the identification portion, based on the current obtained by the current obtaining portion,
   wherein the resistance calculation portion
   calculates the internal resistance of the secondary battery when the current integration value calculated by the current integration value calculation portion is higher than a predetermined lower limit value.

8. The internal resistance calculation device according to claim 1, comprising a current integration value calculation portion that calculates a current integration value during a time from a time point when the switching determination portion determines that switching between charging and discharging is present to the elapse of the waiting time identified by the identification portion, based on the current obtained by the current obtaining portion,
   wherein the resistance calculation portion
   calculates the internal resistance of the secondary battery when the current integration value calculated by the current integration value calculation portion is higher than a predetermined lower limit value.

9. The internal resistance calculation device according to claim 1, comprising a current integration value calculation portion that calculates an after-switching current integration value during a time from the time point when the switching determination portion determines that switching between charging and discharging is present to the elapse of the waiting time identified by the identification portion and a before-switching current integration value during a time from a before-switching time point, the waiting time prior to the above-mentioned time point, to the above-mentioned time point, based on the current obtained by the current obtaining portion,
   wherein the resistance calculation portion
   calculates the internal resistance of the secondary battery when a difference between the after-switching current integration value and the before-switching current integration value is not more than a predetermined difference threshold value.

10. The internal resistance calculation device according to claim 1,
    wherein the resistance calculation portion
    does not calculate the internal resistance of the secondary battery when the time point when the switching determination portion determines that switching between charging and discharging is present is within a predetermined time from the time point when it is most recently determined that switching between charging and discharging is present.

11. The internal resistance calculation device according to claim 1, comprising a current change degree calculation portion that calculates a current change degree based on the current obtained by the current obtaining portion,
wherein the resistance calculation portion
does not calculate the internal resistance of the secondary battery when the current change degree calculated by the current change degree calculation portion is higher than a predetermined change degree threshold value during the time from the time point when the switching determination portion determines that switching between charging and discharging is present to the elapse of the waiting time identified by the identification portion.

12. The internal resistance calculation device according to claim 1,
wherein the identification portion
further identifies the waiting time based on a state of charge
of the secondary battery.

13. The internal resistance calculation device according to claim 1, comprising a temperature obtaining portion that obtains a temperature of the secondary battery,
wherein the identification portion
identifies the waiting time based on the temperature obtained by the temperature obtaining portion.

14. The internal resistance calculation device according to claim 1, comprising:
an open voltage calculation portion that calculates an open voltage of the secondary battery based on the internal resistance calculated by the resistance calculation portion, the voltage obtained by the voltage obtaining portion and the current obtained by the current obtaining portion; and
a state of charge calculation portion that calculates the state of charge of the secondary battery based on the open voltage calculated by the open voltage calculation portion.

15. The internal resistance calculation device according to claim 1, comprising a deterioration degree calculation portion that calculates a deterioration degree of the secondary battery based on a ratio of the internal resistance calculated by the resistance calculation portion to an initial value of the internal resistance of the secondary battery.

16. A computer readable non-transitory recording medium recording a computer program for causing a computer to calculate an internal resistance of a secondary battery, the computer program causing the computer to function as:
a voltage obtaining portion that obtains a voltage of the secondary battery;
a current obtaining portion that obtains a current of the secondary battery;
a switching determination portion that determines the presence or absence of switching between charging and discharging of the secondary battery based on the obtained current;
an identification portion that identifies a waiting time based on a boundary frequency range in which a diffusion impedance arising from a process of diffusion of a predetermined ion contributes to an impedance of the secondary battery in an impedance spectrum of the secondary battery; and
a resistance calculation portion that calculates the internal resistance of the secondary battery based on the voltage and the current obtained after the identified waiting time in a case where it is determined that switching between charging and discharging of the secondary battery is present.

17. An internal resistance calculation method of calculating an internal resistance of a secondary battery,
wherein a voltage obtaining portion obtains a voltage of the secondary battery;
a current obtaining portion obtains a current of the secondary battery;
a switching determination portion determines the presence or absence of switching between charging and discharging of the secondary battery based on the obtained current;
an identification portion identifies a waiting time based on a boundary frequency range in which a diffusion impedance arising from a process of diffusion of a predetermined ion contributes to an impedance of the secondary battery in an impedance spectrum of the secondary battery; and
a resistance calculation portion calculates the internal resistance of the secondary battery based on the voltage and the current obtained after the identified waiting time in a case where it is determined that switching between charging and discharging of the secondary battery is present.

* * * * *